United States Patent
Sato et al.

(10) Patent No.: US 8,969,970 B2
(45) Date of Patent: Mar. 3, 2015

(54) SEMICONDUCTOR DEVICE

(71) Applicant: Panasonic Corporation, Osaka (JP)

(72) Inventors: Yoshihiro Sato, Osaka (JP); Takayuki Yamada, Toyama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/453,392

(22) Filed: Aug. 6, 2014

(65) Prior Publication Data

US 2014/0346610 A1 Nov. 27, 2014

Related U.S. Application Data

(60) Division of application No. 13/396,833, filed on Feb. 15, 2012, now abandoned, which is a continuation of application No. PCT/JP2010/001051, filed on Feb. 18, 2010.

(30) Foreign Application Priority Data

Aug. 21, 2009 (JP) .................................. 2009-191697

(51) Int. Cl.
*H01L 21/70* (2006.01)
*H01L 27/092* (2006.01)
(Continued)

(52) U.S. Cl.
CPC ........ *H01L 27/092* (2013.01); *H01L 21/02247* (2013.01); *H01L 21/02321* (2013.01);
(Continued)

(58) Field of Classification Search
USPC .......................................... 257/369, E27.062
See application file for complete search history.

(56) References Cited

U.S. PATENT DOCUMENTS 7,242,055 B2  7/2007  Bojarczuk, Jr. et al.
7,564,108 B2  7/2009  Wang et al.
(Continued)

FOREIGN PATENT DOCUMENTS

JP  2008-305950 A  12/2008
JP  2009-164218 A   7/2009
(Continued)

OTHER PUBLICATIONS

Jung, Hyung-Suk et al., "A Highly Manufacturable MIPS (Metal Inserted Poly-Si Stack) Technology with Novel Threshold Voltage Control", in: 2005 Symposium on VLSI Technology Digest of Technical Papers, 2005, pp. 232-233.
(Continued)

*Primary Examiner* — Timor Karimy
(74) *Attorney, Agent, or Firm* — McDermott Will & Emery LLP

(57) ABSTRACT

A semiconductor device includes a first MIS transistor and a second MIS transistor. The first MIS transistor includes a first gate insulating film which is formed on a first active region of a semiconductor substrate and has a first high dielectric constant film, and a first gate electrode formed on the first gate insulating film. The second MIS transistor includes a second gate insulating film which is formed on a second active region of the semiconductor substrate and has a second high dielectric constant film, and a second gate electrode formed on the second gate insulating film. The second high dielectric constant film contains first adjusting metal. The first high dielectric constant film has a higher nitrogen concentration than the second high dielectric constant film, and does not contain the first adjusting metal.

16 Claims, 11 Drawing Sheets

(51) Int. Cl.
  *H01L 21/02* (2006.01)
  *H01L 21/28* (2006.01)
  *H01L 21/3115* (2006.01)
  *H01L 21/8238* (2006.01)
  *H01L 29/49* (2006.01)
  *H01L 29/51* (2006.01)
  *H01L 29/66* (2006.01)
  *H01L 29/78* (2006.01)

(52) U.S. Cl.
  CPC ...... *H01L21/02332* (2013.01); *H01L 21/0234* (2013.01); *H01L 21/28202* (2013.01); *H01L 21/3115* (2013.01); *H01L 21/823857* (2013.01); *H01L 29/4966* (2013.01); *H01L 29/513* (2013.01); *H01L 29/518* (2013.01); *H01L 29/6659* (2013.01); *H01L 29/7833* (2013.01); *H01L 29/7843* (2013.01); *H01L 29/517* (2013.01); *H01L 29/665* (2013.01); *H01L 29/6656* (2013.01)
  USPC .................................. 257/369; 257/E27.062

(56) References Cited

U.S. PATENT DOCUMENTS

| | | |
|---|---|---|
| 2006/0081939 A1 | 4/2006 | Akasaka et al. |
| 2008/0191286 A1 | 8/2008 | Chang et al. |
| 2009/0039437 A1 | 2/2009 | Ogawa |
| 2010/0148280 A1 | 6/2010 | Mitsuhashi |
| 2010/0279496 A1 | 11/2010 | Kadoshima et al. |

FOREIGN PATENT DOCUMENTS

| | | |
|---|---|---|
| JP | 2010-157587 A | 7/2010 |
| JP | 2010-177265 A | 8/2010 |
| JP | 2011-035158 A | 1/2011 |
| JP | 2011-035229 A | 2/2011 |

OTHER PUBLICATIONS

Alshareef, H.N. et al., "Thermally Stable N-Metal Gate MOSFETs Using La-Incorporated HfSiO Dielectric" in: 2006 Symposium on VLSI Technology Digest of Technical Papers, 2006, 1-4244-005-8/6$20.00(c)2006IEEE.

Hussain, Muhammad Mustafa et al., "Compatibility of ALD Hafnium Silicate with Dual Metal Gate CMOS Integration" in Extended Abstracts of the 2006 International Conference on Solid State Devices and Materials, Yokohama, 2006, pp. 1114-1115, J-8-4.

International Search Report of PCT Application No. PCT/JP2010/001051, dated May 25, 2010.

U.S. Non-Final Office Action issued in U.S. Appl. No. 13/396,833 dated Jan. 21, 2014.

U.S. Final Office Action issued in U.S. Appl. No. 13/396,833 dated May 14, 2014.

SEMICONDUCTOR DEVICE

CROSS-REFERENCE TO RELATED APPLICATION

This application is a Divisional of U.S. application Ser. No. 13/396,833, filed on Feb. 15, 2012, which is a continuation of PCT International Application PCT/JP2010/001051 filed on Feb. 18, 2010, which claims priority to Japanese Patent Application No. 2009-191697 filed on Aug. 21, 2009. The disclosures of these applications including the specifications, the drawings, and the claims are hereby incorporated by reference in their entirety.

BACKGROUND

The present disclosure relates to a semiconductor device, and a method for fabricating the same, particularly to a semiconductor device including a metal insulator semiconductor field-effect transistor (MISFET) having a gate insulating film including a high dielectric constant film, and a method for fabricating the same.

For higher performance of semiconductor integrated circuits, a gate insulating film made of a high dielectric constant material, typically alumina ($Al_2O_3$), hafnium oxide ($HfO_2$), and hafnium silicate (HfSiOx), has been taking the place of a conventional gate insulating film made of a silicon oxide film or a silicon oxynitride film. Further, a full-metal gate electrode made of a metal film, or a gate electrode constituted of a metal-inserted polysilicon stack (MIPS) having a metal film inserted between a gate insulating film and a polysilicon film has been taking the place of a conventional gate electrode made of a polysilicon film.

Threshold voltages of an n-type MISFET (hereinafter referred to as an n-type MIS transistor), and a p-type MISFET (hereinafter referred to as a p-type MIS transistor) can be controlled by using gate electrodes having metal films made of metal materials different from each other in the n-type MIS transistor and the p-type MIS transistor. When an MIS transistor has a gate insulating film including a high dielectric constant film, and a gate electrode including a metal film, the threshold voltage of the MIS transistor can be controlled based on a work function of the metal material of the metal film in the gate electrode.

However, the above method has the following demerits. For example, since the materials of the gate electrodes of the n-type and p-type MIS transistors are different, the gate electrodes of the n-type and p-type MIS transistors need to be formed separately, which complicates fabrication steps. Further, a margin (an allowance) of an N/P boundary region between the n-type and p-type MIS transistors needs to be increased, thereby making densification and miniaturization of the n-type and p-type MIS transistors difficult.

According to another method for controlling the threshold voltages of the n-type and p-type MIS transistors, the gate electrodes of the n-type and p-type MIS transistors are made of the same material. A gate insulating film including a high dielectric constant film containing lanthanum (La) is used in the n-type MIS transistor, and a gate insulating film including a high dielectric constant film containing aluminum (Al) is used in the p-type MIS transistor (see, e.g., Non-Patent Document 1: Hyung-Suk Jung et al., "A Highly Manufacturable MIPS (Metal Inserted Poly-Si Stack) Technology with Novel Threshold Voltage Control," VLSI Tech. Digest 2005, and Non-Patent Document 2: H. N. Alshareef et al., "Thermally Stable N-Metal Gate MOSFETs Using La-Incorporated HfSiO Dielectric," VLSI Tech. Digest 2006).

The above method is advantageous because has the following merits. For example, the fabrication steps are simple because the gate electrodes of the n-type and p-type MIS transistors are made of the same material. Further, the gate electrodes can easily be processed.

SUMMARY

According to studies of the inventors of the present application, the following disadvantages have been found in the semiconductor device including the n-type MIS transistor having the gate insulating film including the La-containing high dielectric constant film, and the p-type MIS transistor having the gate insulating film including the Al-containing high dielectric constant film. The disadvantages will be described with reference to FIGS. 9A-9C.

FIG. 9A is a graph showing a relationship between a nitrogen concentration in a high dielectric constant film of a gate insulating film and an effective work function of a p-type MIS transistor. FIG. 9B is a graph showing a relationship between a thickness of an Al cap film and the effective work function of the p-type MIS transistor. FIG. 9C is a graph showing a relationship between the thickness of the Al cap film and an equivalent oxide thickness of the high dielectric constant film of the gate insulating film.

The MIS transistor used for the evaluations of FIGS. 9A-9C and FIGS. 10 and 11A-11B described later includes, a gate insulating film including an $SiO_2$ underlying film and a high dielectric constant film formed on an Si semiconductor substrate, and a gate electrode including a metal film made of TiN, and a silicon film made of polysilicon.

The high dielectric constant film (e.g., an HfSiON film containing Al) in the gate insulating film of the p-type MIS transistor evaluated in FIGS. 9A-9C is formed in the following manner. An Al-containing cap film (hereinafter referred to as an Al cap film) is formed on an HfSiON film, and Al contained in the Al cap film is diffused into the HfSiON film. Thus, the Al-containing HfSiON film (an HfAlSiON film) is formed.

Concentrations A, B, and C indicated in a horizontal axis of the graph of FIG. 9A show a nitrogen concentration in the high dielectric constant film of the gate insulating film. Concentration A is lower than Concentration B, and Concentration B is lower than Concentration C.

When a high dielectric constant film containing nitrogen (e.g., an HfSiON film) is used as the film in which Al contained in the Al cap film is diffused (i.e., the film formed below the Al cap film), the following problem arises. As shown in FIG. 9A, the effective work function of the p-type MIS transistor decreases as the nitrogen concentration in the high dielectric constant film (e.g., an Al-containing HfSiON film) of the gate insulating film increases. A possible reason for the problem is as follows. As the nitrogen concentration in the HfSiON film (i.e., the film formed below the Al cap film) increases, diffusion of Al into the HfSiON film is reduced, and the amount of Al diffused into the HfSiON film is reduced. This cannot increase a shift amount of a flat band voltage, thereby reducing the effective work function of the p-type MIS transistor.

The effective work function of the p-type MIS transistor can be increased by the following method. As shown in FIG. 9B, the effective work function of the p-type MIS transistor increases as the Al cap film becomes thicker. Thus, the effective work function of the p-type MIS transistor can be increased by thickening the Al cap film.

However, a problem arises when the Al cap film is thickened. Specifically, as shown in FIG. 9C, the equivalent oxide thickness of the high dielectric constant film in the gate insulating film increases as the Al cap film is thickened. Thus, although the effective work function of the p-type MIS transistor can be increased by thickening the Al cap film as shown in FIG. 9B, the equivalent oxide thickness (EOT) of the high dielectric constant film in the gate insulating film of the p-type MIS transistor increases as shown in FIG. 9C.

As described above, the effective work function of the p-type MIS transistor decreases as the nitrogen concentration in the high dielectric constant film of the gate insulating film increases as shown in FIG. 9A. Then, when the Al cap film is thickened, the effective work function of the p-type MIS transistor can be increased as shown in FIG. 9B, but the equivalent oxide thickness of the high dielectric constant film in the gate insulating film increases as shown in FIG. 9C.

In view of the foregoing, the present disclosure is directed to a semiconductor device including n-type and p-type MIS transistors each having a gate insulating film including a high dielectric constant film. The disclosure is concerned with reducing the increase in equivalent oxide thickness of the gate insulating film of the p-type MIS transistor, and increasing the effective work function of the p-type MIS transistor, thereby providing the n-type and p-type MIS transistors with low threshold voltages.

In view of the above concern, the inventors of the present application have found the followings from their close studies. The findings will be described with reference to FIGS. 10, 11A, and 11B.

—P-Type MIS Transistor—

FIG. 10 is a graph showing a relationship between a change in flat band voltage (ΔVfb) and a change in equivalent oxide thickness (ΔEOT) when Al is diffused from the Al cap films of various thicknesses into an HfSiO film and an HfSiON film.

The results of FIG. 10 are obtained as described below.

A nitrogen-free high dielectric constant film, e.g., an HfSiO film (see a plot of squares), is used as a film in which Al contained in the Al cap film is diffused. An Al cap film having a thickness of x nm is formed on the HfSiO film, and Al contained in the Al cap film is diffused into the HfSiO film to form an HfSiO film containing Al (an HfAlSiO film). Regarding values ΔVfb and ΔEOT when the thickness of the Al cap film is 0 nm as 0, the values ΔVfb and ΔEOT when the thickness of the Al cap film is x nm are obtained. Five squares plotted in the graph of FIG. 10 indicate the values ΔVfb and ΔEOT when the thickness of the Al cap film is 0 nm, 0.1 nm, 0.3 nm, 0.5 nm, and 0.7 nm (from left to right).

A nitrogen-containing high dielectric constant film, e.g., an HfSiON film (see a plot of triangles), is used as the film in which Al contained in the Al cap film is diffused. An Al cap film having a thickness of y nm is formed on the HfSiON film, and Al contained in the Al cap film is diffused into the HfSiON film to form an HfSiON film containing Al. Regarding values ΔVfb and ΔEOT when the thickness of the Al cap film is 0 nm as 0, the values ΔVfb and ΔEOT when the thickness of the Al cap film is y nm are obtained. Six triangles plotted in the graph of FIG. 10 indicate the values ΔVfb and ΔEOT when the thickness of the Al cap film is 0 nm, 0.1 nm, 0.3 nm, 0.4 nm, 0.5 nm, and 0.7 nm (from left to right).

As apparent from FIG. 10, ΔVfb is larger when the HfSiO film is used as the film in which Al is diffused from the Al cap film than when the HfSiON film is used. This indicates that reducing the nitrogen concentration in the high dielectric constant film of the gate insulating film can reduce the increase in equivalent oxide thickness of the gate insulating film, and can increase a shift amount of a flat band voltage, thereby increasing the effective work function of the p-type MIS transistor.

—N-Type MIS Transistor—

FIG. 11A is a graph showing a relationship between a nitrogen concentration in a high dielectric constant film of a gate insulating film and an effective work function of an n-type MIS transistor. FIG. 11B is a graph showing a relationship between the nitrogen concentration in the high dielectric constant film of the gate insulating film and an equivalent oxide thickness of the high dielectric constant film.

The high dielectric constant film (e.g., an HfSiON film containing La) of the gate insulating film of the n-type MIS transistor evaluated in FIGS. 11A-11B is formed in the following manner. A cap film containing La (hereinafter referred to as an La cap film) is formed on an HfSiON film, and La contained in the La cap film is diffused into the HfSiON film. Thus, the La-containing HfSiON film (an HfLaSiON film) is formed.

Concentrations A, B, and C indicated in a horizontal axis of the graph of FIGS. 11A-11B show the nitrogen concentration in the high dielectric constant film of the gate insulating film. Concentration A is lower than concentration B, and Concentration B is lower than Concentration C.

When a nitrogen-containing high dielectric constant film (e.g., an HfSiON film) is used as a film in which La contained in the La cap film is diffused (i.e., a film formed below the La cap film), the effective work function of the n-type MIS transistor does not greatly vary depending on the nitrogen concentration in the high dielectric constant film (e.g. an La-containing HfSiON film) of the gate insulating film as shown in FIG. 11A. Further, as shown in FIG. 11B, the equivalent oxide thickness of the high dielectric constant film of the gate insulating film does not greatly vary depending on the nitrogen concentration in the high dielectric constant film.

As described above, even when the nitrogen concentration in the high dielectric constant film of the gate insulating film is increased in the n-type MIS transistor, the effective work function of the n-type MIS transistor is not reduced as shown in FIG. 11A. Further, the equivalent oxide thickness of the high dielectric constant film of the gate insulating film is not increased as shown in FIG. 11B.

Thus, the present disclosure is concerned with making the nitrogen concentration in the high dielectric constant film of the gate insulating film of the p-type MIS transistor lower than the nitrogen concentration in the high dielectric constant film of the gate insulating film of the n-type MIS transistor.

In view of the above concern, the present disclosure has been achieved based on the inventors' findings. Specifically, a semiconductor device of the present disclosure includes: a first MIS transistor and a second MIS transistor, wherein the first MIS transistor includes a first gate insulating film which is formed on a first active region of a semiconductor substrate, and has a first high dielectric constant film, and a first gate electrode formed on the first gate insulating film, the second MIS transistor includes a second gate insulating film which is formed on a second active region of the semiconductor substrate, and has a second high dielectric constant film, and a second gate electrode formed on the second gate insulating film, the second high dielectric constant film contains a first adjusting metal, and the first high dielectric constant film has a higher concentration of nitrogen than the second high dielectric constant film, and does not contain the first adjusting metal.

In the disclosed semiconductor device, the nitrogen concentration in the second high dielectric constant film can be made lower than the nitrogen concentration in the first high dielectric constant film. This can reduce a decrease in amount of the first adjusting metal diffused into the second high dielectric constant film. Thus, an increase in equivalent oxide thickness of the second gate insulating film can be reduced, and a shift amount of the flat band voltage can be increased, thereby increasing the effective work function of the second MIS transistor, and providing the second MIS transistor with a low threshold voltage. Even when the nitrogen concentration in the first high dielectric constant film is higher than the nitrogen concentration in the second high dielectric constant film, the effective work function of the first MIS transistor is not reduced, and the equivalent oxide thickness of the first high dielectric constant film is not increased. Thus, the first MIS transistor can be provided with a low threshold voltage without increasing the equivalent oxide thickness of the first gate insulating film.

Thus, the increase in equivalent oxide thickness of the second gate insulating film can be reduced, the effective work function of the second MIS transistor can be increased, thereby providing the first and second MIS transistors can be provided with low threshold voltages.

In addition, the first high dielectric constant film contains nitrogen, and can reduce crystallization of the first high dielectric constant film, thereby reducing a decrease in reliability. Further, the first high dielectric constant film containing nitrogen can reduce the equivalent oxide thickness of the first high dielectric constant film. The second high dielectric constant film contains the first adjusting metal, and can reduce crystallization of the second high dielectric constant film, thereby reducing a decrease in reliability.

In the disclosed semiconductor device, it is preferable that the first high dielectric constant film contains nitrogen, and the second high dielectric constant film does not contain nitrogen.

Since the second high dielectric constant film does not contain nitrogen, a decrease in amount of the first adjusting metal diffused into the second high dielectric constant film can efficiently be reduced.

In the disclosed semiconductor device, the first adjusting metal is preferably aluminum.

In the disclosed semiconductor device, it is preferable that the first high dielectric constant film contains a second adjusting metal, and the second high dielectric constant film does not contain the second adjusting metal.

This can increase the shift amount of the flat band voltage, and can increase the effective work function of the first MIS transistor, thereby providing the first MIS transistor with a low threshold voltage.

In the disclosed semiconductor device, the second adjusting metal is preferably lanthanum.

In the disclosed semiconductor device, the first gate insulating film preferably includes a first underlying film formed on the first active region, and the first high dielectric constant film formed on the first underlying film, and the second gate insulating film preferably includes a second underlying film formed on the second active region, and the second high dielectric constant film formed on the second underlying film.

In the disclosed semiconductor device, the first underlying film and the second underlying film are preferably made of a silicon oxide film.

In the disclosed semiconductor device, the first high dielectric constant film and the second high dielectric constant film are preferably made of metal oxide having a dielectric constant of 10 or higher.

In the disclosed semiconductor device, the first gate electrode preferably includes a first metal film formed on the first gate insulating film, and a first silicon film formed on the first metal film, and the second gate electrode preferably includes a second metal film formed on the second gate insulating film, and a second silicon film formed on the second metal film.

It is preferable that the disclosed semiconductor device further includes: a first sidewall which is formed on a side surface of the first gate electrode, and has an L-shaped cross section; a second sidewall which is formed on a side surface of the second gate electrode, and has an L-shaped cross section; and an insulating film formed on the first active region and the second active region to cover the first gate electrode, the first sidewall, the second gate electrode, and the second sidewall.

In the disclosed semiconductor device, the insulating film is preferably a stress-applying insulating film which applies tensile stress in a gate length direction of a channel region of the first active region, and the insulating film is preferably in contact with a surface of the first sidewall.

The stress-applying insulating film can apply the tensile stress in the gate length direction of the channel region of the first active region, thereby improving drive capability of the first MIS transistor.

In the disclosed semiconductor device, the first MIS transistor is preferably an n-type MIS transistor, and the second MIS transistor is preferably a p-type MIS transistor.

In view of the above concern, the present disclosure provides a method for fabricating a semiconductor device including a first MIS transistor formed on a first active region of a semiconductor device, and a second MIS transistor formed on a second active region of the semiconductor device, the method including: forming a high dielectric constant film on the first active region and the second active region; forming a first adjusting metal film on a first part of the high dielectric constant film on the second active region; introducing first nitrogen into a second part of the high dielectric constant film on the first active region after the forming of the first adjusting metal film; forming a gate electrode film on the second part of the high dielectric constant film and the first adjusting metal film after the introduction of nitrogen; sequentially forming a first gate insulating film including a first high dielectric constant film made of the second part of the high dielectric constant film, and a first gate electrode made of the gate electrode film on the first active region, and sequentially forming a second gate insulating film including a second high dielectric constant film made of the first part of the high dielectric constant film and the first adjusting metal film, and a second gate electrode made of the gate electrode film on the second active region by sequentially patterning the gate electrode film, the first adjusting metal film, and the high dielectric constant film; and diffusing a first adjusting metal contained in the first adjusting metal film into the second high dielectric constant film of the second gate insulating film after the forming of the first and second insulating films and the first and second gate electrodes, wherein the first high dielectric constant film does not contain the first adjusting metal, but contains the first nitrogen, the second high dielectric constant film contains the first adjusting metal, and the first high dielectric constant film has a nitrogen concentration higher than the second high dielectric constant film.

In the disclosed method for fabricating the semiconductor device, the first high dielectric constant film containing the first nitrogen, and the second high dielectric constant film having a lower nitrogen concentration than the first high dielectric constant film, and containing the first adjusting metal can be formed. With the nitrogen concentration in the second high dielectric constant film lower than the nitrogen concentration in the first high dielectric constant film, a decrease in amount of the first adjusting metal diffused into the second high dielectric constant film can be reduced. Thus, an increase in equivalent oxide thickness of the second gate insulating film can be reduced, and a shift amount of the flat band voltage can be increased, thereby increasing the effective work function of the second MIS transistor, and providing the second MIS transistor with a low threshold voltage. Even when the nitrogen concentration in the first high dielectric constant film is higher than the nitrogen concentration in the second high dielectric constant film, the effective work function of the first MIS transistor is not reduced, and the equivalent oxide thickness of the first high dielectric constant film is not increased. Thus, the first MIS transistor can be provided with a low threshold voltage without increasing the equivalent oxide thickness of the first gate insulating film.

Thus, the increase in equivalent oxide thickness of the second gate insulating film can be reduced, the effective work function of the second MIS transistor can be increased, thereby providing the first and second MIS transistors can be provided with low threshold voltages.

In addition, the first high dielectric constant film contains the first nitrogen, and can reduce crystallization of the first high dielectric constant film, thereby reducing a decrease in reliability. Further, the first high dielectric constant film containing the first nitrogen can reduce the equivalent oxide thickness of the first high dielectric constant film. The second high dielectric constant film contains the first adjusting metal, and can reduce crystallization of the second high dielectric constant film, thereby reducing a decrease in reliability.

It is preferable that the disclosed method further includes: diffusing a second adjusting metal into the second part of the high dielectric constant film after the forming of the first adjusting metal film and before the introduction of the first nitrogen, wherein the first high dielectric constant film contains the second adjusting metal, and the second high dielectric constant film does not contain the second adjusting metal.

This can increase the shift amount of the flat band voltage, and can increase the effective work function of the first MIS transistor, thereby providing the first MIS transistor with a low threshold voltage.

It is preferable that the disclosed method further includes: introducing second nitrogen into the second part of the high dielectric constant film after the forming of the high dielectric constant film and before the forming of the first adjusting metal film, wherein the first high dielectric constant film contains the first nitrogen and the second nitrogen.

This allows sequential introduction of the second nitrogen and the first nitrogen into the second part of the high dielectric constant film, and allows precise control of the nitrogen concentration in the first high dielectric constant film.

It is preferable that the disclosed method further includes: forming an underlying film on the first active region and the second active region before the forming of the high dielectric constant film, wherein the high dielectric constant film is formed on the underlying film in the forming of the high dielectric constant film, and the forming of the first and second gate insulating films and the first and second gate electrodes includes: sequentially forming the first gate insulating film including a first underlying film made of the underlying film and the first high dielectric constant film, and the first gate electrode on the first active region, and sequentially forming the second gate insulating film including a second underlying film made of the underlying film, the second high dielectric constant film, and the first adjusting metal film, and the second gate electrode on the second active region by sequentially patterning the gate electrode film, the first adjusting metal film, the high dielectric constant film, and the underlying film.

In the disclosed method, the forming of the gate electrode film includes forming a metal film on the second part of the high dielectric constant film and the first adjusting metal film, and forming a silicon film on the metal film to form the gate electrode film including the metal film and the silicon film, and the forming of the first and second gate insulating films and the first and second gate electrodes includes sequentially forming the first gate insulating film, and the first gate electrode including a first metal film made of the metal film and a first silicon film made of the silicon film on the first active region, and sequentially forming the second gate insulating film, and the second gate electrode including a second metal film made of the metal film and a second silicon film made of the silicon film on the second active region by patterning the silicon film, the metal film, the first adjusting metal film, and the high dielectric constant film.

Thus, according to the disclosed semiconductor device and the disclosed method for fabricating the semiconductor device, the increase in equivalent oxide thickness of the second gate insulating film can be reduced, and the effective work function of the second MIS transistor can be increased, thereby providing the first and second MIS transistors with low threshold voltages.

DETAILED DESCRIPTION

First Embodiment

A semiconductor device and a method for fabricating the same according to a first embodiment of the present disclosure will be described with reference to the drawings.

The method for fabricating the semiconductor device according to the first embodiment of the present disclosure will be described with reference to FIGS. 1A-1D, FIGS. 2A-2D, and FIGS. 3A-3C. FIGS. 1A-3C are cross-sectional views sequentially illustrating steps for fabricating the semiconductor device according to the first embodiment of the present disclosure. In FIGS. 1A-3C, and FIGS. 4A-5C, FIGS. 6A-7C, and FIGS. 8A-8C described later, an "nMIS region" on the left designates a region for forming an n-type MIS transistor, and a "pMIS region" on the right designates a region for forming a p-type MIS transistor.

Figure 1A:
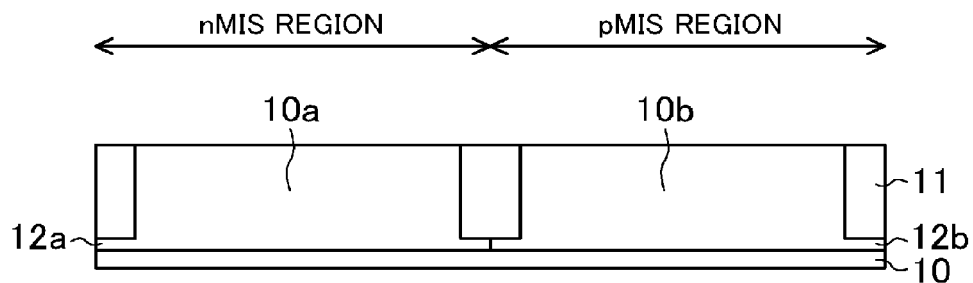
FIGS. 1A-1D sequentially show steps for fabricating a semiconductor device of a first embodiment of the present disclosure in cross-sectional views taken in a gate length direction.

As shown in FIG. 1A, an isolation region 11 is selectively formed by filling a trench in an upper portion of a semiconductor substrate 10 made of p-type silicon with an insulating film by, for example, shallow trench isolation (STI). Thus, a first active region 10a surrounded by the isolation region 11 is formed in an nMIS region of the semiconductor substrate 10, and a second active region 10b surrounded by the isolation region 11 is formed in a pMIS region of the semiconductor substrate 10. Then, p-type impurities, such as boron (B), are implanted in the nMIS region of the semiconductor substrate 10, and n-type impurities, such as phosphorus (P), are implanted in the pMIS region of the semiconductor substrate 10 by lithography and ion implantation. Then, the semiconductor substrate 10 is thermally treated at 850° C. for 30 seconds, for example. Thus, a p-type well region 12a is formed in the nMIS region of the semiconductor substrate 10, and an n-type well region 12b is formed in the pMIS region of the semiconductor substrate 10.

Figure 1B:
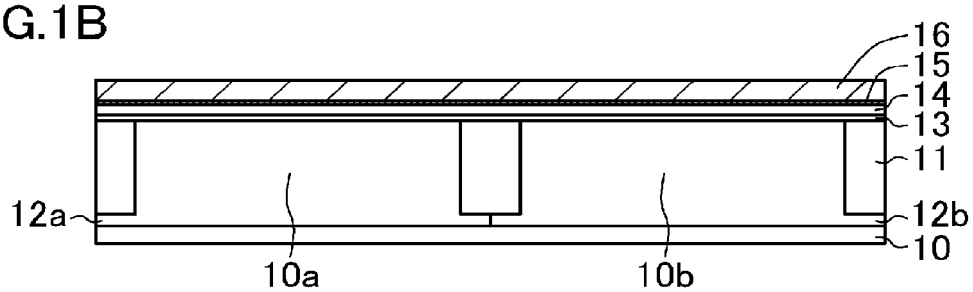

Then, as shown in FIG. 1B, a surface of the semiconductor substrate 10 is cleaned with, for example, diluted hydrofluoric acid. Then, a 0.8 nm-1 nm thick underlying film 13 made of a silicon oxide film (an $SiO_2$ film) or a silicon oxynitride film (an SiON film) is formed on the first active region 10a and the second active region 10b by, for example, in-situ steam generation (ISSG) oxidation.

Then, a 2 nm thick, nitrogen-free high dielectric constant film 14 (e.g., an HfSiO film) is deposited on the underlying film 13 by, for example, metal organic chemical vapor deposition (MOCVD), atomic layer deposition (ALD), etc. The high dielectric constant film 14 is preferably made of metal oxide having a dielectric constant of 10 or higher. Examples of the material of the high dielectric constant film 14 may include hafnium silicate (HfSiO), hafnium oxide ($HfO_2$), zirconium oxide ($ZrO_2$), etc.

Then, a 0.3 nm thick first adjusting metal film 15 is deposited on the high dielectric constant film 14 by, for example, sputtering. The first adjusting metal film 15 contains a first adjusting metal, such as Al. The first adjusting metal film 15 may be made of, for example, Al or aluminum oxide ($Al_2O_3$).

Then, a 5 nm thick protective film 16 made of titanium nitride (TiN) is deposited by, for example, chemical vapor deposition (CVD), ALD, sputtering, etc.

Figure 1C:
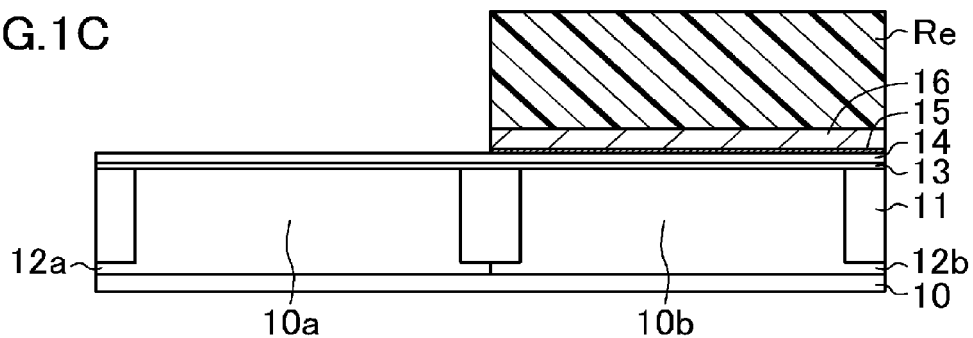

Then, as shown in FIG. 1C, a resist pattern Re which exposes the nMIS region, and covers the pMIS region is formed on the protective film 16 by lithography. Using the resist pattern Re as a mask, the protective film 16 and the first adjusting metal film 15 are sequentially removed from the nMIS region by, for example, wet etching with high selectivity to the high dielectric constant film 14.

Figure 1D:
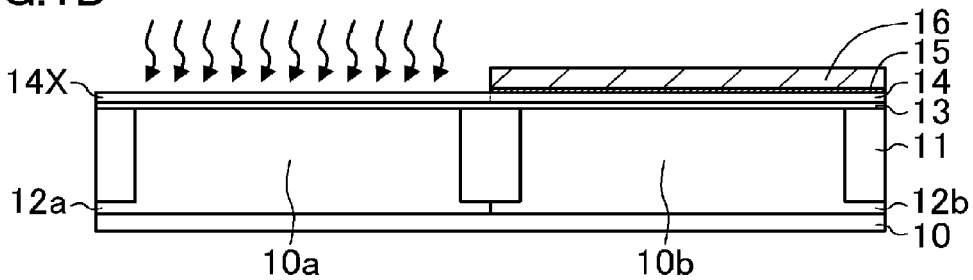

The resist pattern Re is then removed as shown in FIG. 1D. Thus, the first adjusting metal film 15 and the protective film 16 are sequentially provided on part of the high dielectric constant film 14 in the pMIS region (including a first part of the high dielectric constant film 14 on the second active region 10b).

Using the protective film 16 as a mask, nitrogen (first nitrogen) is introduced into part of the high dielectric constant film 14 in the nMIS region (including a second part of the high dielectric constant film 14 on the first active region 10a) by, for example, nitrogen plasma treatment. Nitrogen is introduced in the part of high dielectric constant film 14 in the nMIS region in such a manner that a nitrogen concentration in the high dielectric constant film 14 gradually decreases from the top to the bottom, and nitrogen reaches the nMIS region in the semiconductor substrate 10. The protective film 16 formed on the first adjusting metal film 15 can prevent introduction of nitrogen in the first adjusting metal film 15. Thus, as described later, in performing a thermal treatment (a thermal treatment for diffusing n-type and p-type impurities contained in n-type and p-type source/drain regions), diffusion of nitrogen from the first adjusting metal film 15b into a second high dielectric constant film 14b can be prevented.

In this way, a nitrogen-containing high dielectric constant film (e.g., an HfSiON film) 14X is formed on the underlying film 13 in the nMIS region. The nitrogen concentration in the high dielectric constant film 14X gradually decreases from the top to the bottom. A nitrogen-free high dielectric constant film 14 is formed on the underlying film 13 in the pMIS region. The "nitrogen-free high dielectric constant film" designates a high dielectric constant film in which nitrogen is not intentionally introduced.

Figure 2A:
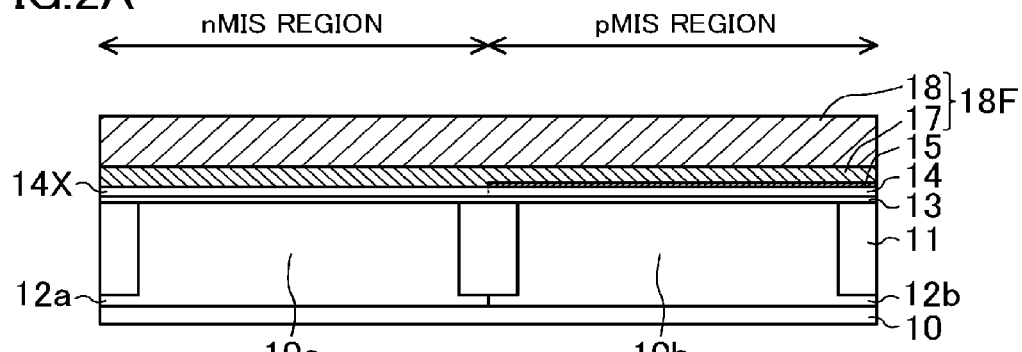
FIGS. 2A-2D sequentially show steps for fabricating the semiconductor device of the first embodiment of the present disclosure in cross-sectional views taken in the gate length direction.

As shown in FIG. 2A, the protective film 16 is removed by, for example, wet etching with high selectivity to the first adjusting metal film 15.

Then, a 10 nm thick metal film 17 made of TiN is deposited on the nitrogen-containing high dielectric constant film 14X and the first adjusting metal film 15 by, for example, CVD, ALD, sputtering, etc. Then, a 100 nm thick silicon film 18 made of polysilicon is deposited on the metal film 17 by, for example, CVD.

In this way, a gate electrode film 18F including the metal film 17 and the silicon film 18 is formed on the nitrogen-containing high dielectric constant film 14X and the first adjusting metal film 15.

Figure 2B:
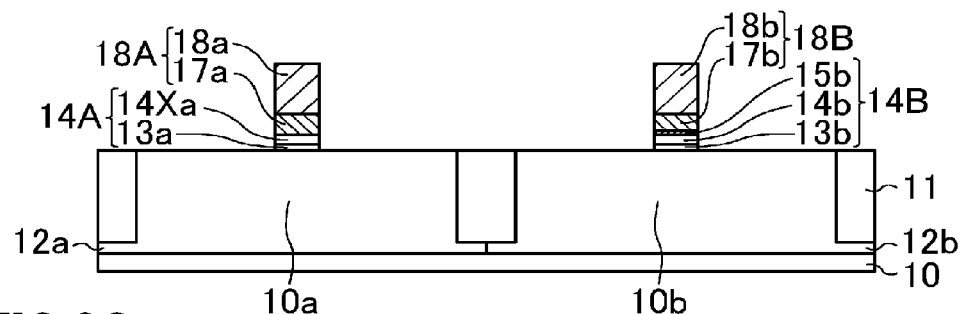

As shown in FIG. 2B, a resist pattern (not shown) is formed on the silicon film 18 by lithography. Using the resist pattern as a mask, the silicon film 18, the metal film 17, the first adjusting metal film 15, the nitrogen-containing high dielectric constant film 14X, the nitrogen-free high dielectric constant film 14, and the underlying film 13 are sequentially patterned by dry etching. Thus, a first gate insulating film 14A including a first underlying film 13a and a first high dielectric constant film 14Xa containing nitrogen, and a first gate electrode 18A including a first metal film 17a and a first silicon film 18a are sequentially formed on the first active region 10a. Simultaneously, a second gate insulating film 14B including a second underlying film 13b, a second high dielectric constant film 14b containing no nitrogen, and a first adjusting metal film 15b, and a second gate electrode 18B including a second metal film 17b and a second silicon film 18b are sequentially formed on the second active region 10b.

Figure 2C:
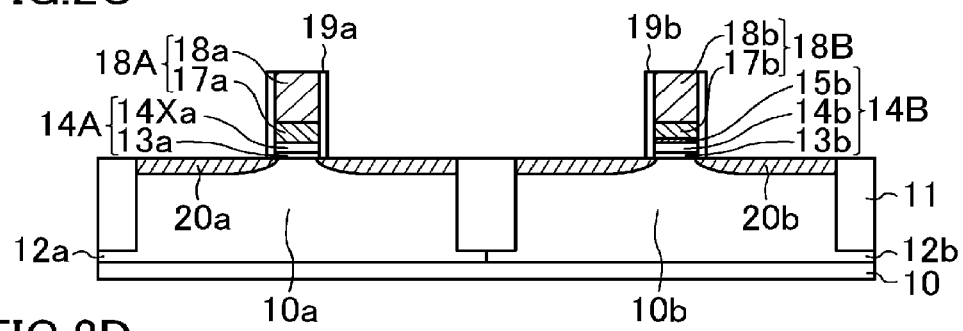

As shown in FIG. 2C, a 8 nm thick insulating film made of a silicon oxide film is deposited on the entire surface of the semiconductor substrate 10 by, for example, CVD. Then, the insulating film is anisotropically etched to form first offset spacers 19a on side surfaces of the first gate electrode 18A, and second offset spacers 19b on side surfaces of the second gate electrode 18B.

Then, n-type impurities, such as arsenic (As), etc., are implanted in the first active region 10a by lithography and ion implantation using the first gate electrode 18A as a mask. Thus, n-type source/drain regions (LDD regions or extension regions) 20a having a relatively shallow junction depth are formed in self-alignment in the first active region 10a below the sides of the first gate electrode 18A. Further, p-type impurities, such as $BF_2$, etc., are implanted in the second active region 10b by lithography and ion implantation using the second gate electrode 18B as a mask. Thus, p-type source/drain regions (LDD regions or extension regions) 20b having a relatively shallow junction depth are formed in self-alignment in the second active region 10b below the sides of the second gate electrode 18B.

Figure 2D:
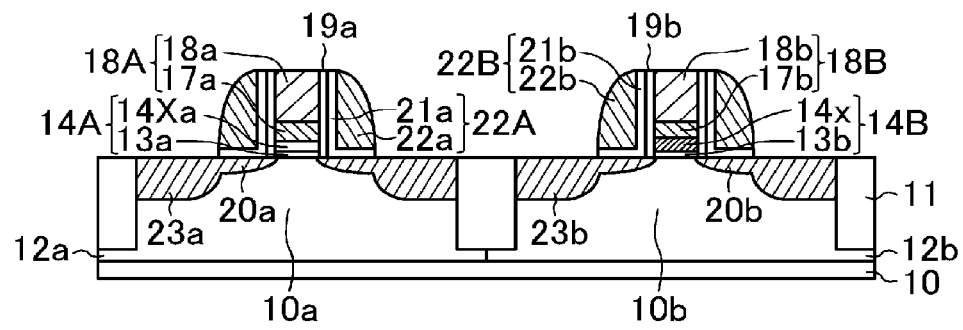

As shown in FIG. 2D, a 10 nm thick insulating film made of a silicon oxide film, and a 30 nm thick insulating film made of a silicon nitride film are sequentially deposited on the entire surface of the semiconductor substrate 10 by, for example, CVD. Then, the insulating films are anisotropically etched to form first sidewalls 22A, each of which includes a first inner sidewall 21a having an L-shaped cross section and a first outer sidewall 22a, on the side surfaces of the first gate electrode 18A with the first offset spacers 19a interposed therebetween. Simultaneously, second sidewalls 22B, each of which includes a second inner sidewall 21b having an L-shaped cross section and a second outer sidewall 22b, are formed on the side surfaces of the second gate electrode 18B with the second offset spacers 19b interposed therebetween.

Then, n-type impurities, such as As, etc., are implanted in the first active region 10a by lithography and ion implantation using the first gate electrode 18A, the first offset spacers 19a, and the first sidewalls 22A as a mask. Thus, n-type source/drain regions 23a having a relatively deep junction depth are formed in self-alignment in the first active region 10a outside the first sidewalls 22A. Further, p-type impurities, such as boron (B), etc., are implanted in the second active region 10b by lithography and ion implantation using the second gate electrode 18B, the second offset spacers 19b, and the second sidewalls 22B as a mask. Thus, p-type source/drain regions 23b having a relatively deep junction depth are formed in self-alignment in the second active region 10b outside the second sidewalls 22B.

Then, the n-type and p-type impurities contained in the deep n-type and p-type source/drain regions 23a, 23b are activated by a thermal treatment. Simultaneously, the first adjusting metal (Al) contained in the first adjusting metal film 15b is diffused into the second high dielectric constant film 14b containing no nitrogen. In this step, Al is diffused into the second high dielectric constant film 14b to make an Al concentration gradually decrease from the top to the bottom. Since the second high dielectric constant film 14b does not contain nitrogen, Al can be diffused into the second high dielectric constant film 14b while effectively reducing the decrease in amount of Al diffused into the second high dielectric constant film 14b. Further, since nitrogen is not introduced in the first adjusting metal film 15 in the nitrogen plasma treatment as described above, nitrogen is not diffused from the first adjusting metal film 15b into the second high dielectric constant film 14b. Thus, a second high dielectric constant film (e.g., an HfAlSiO film) 14x containing Al is formed between the second underlying film 13b and the second gate electrode 18B.

In this way, the second gate insulating film 14B including the second underlying film 13b, and the second high dielectric constant film 14x which does not contain nitrogen, but contains Al is formed. The Al concentration in the second high dielectric constant film 14x gradually decreases from the top to the bottom. The thickness of the second high dielectric constant film 14x is the sum of the thickness of the second high dielectric constant film 14b and the thickness of the first adjusting metal film 15b.

Figure 3A:
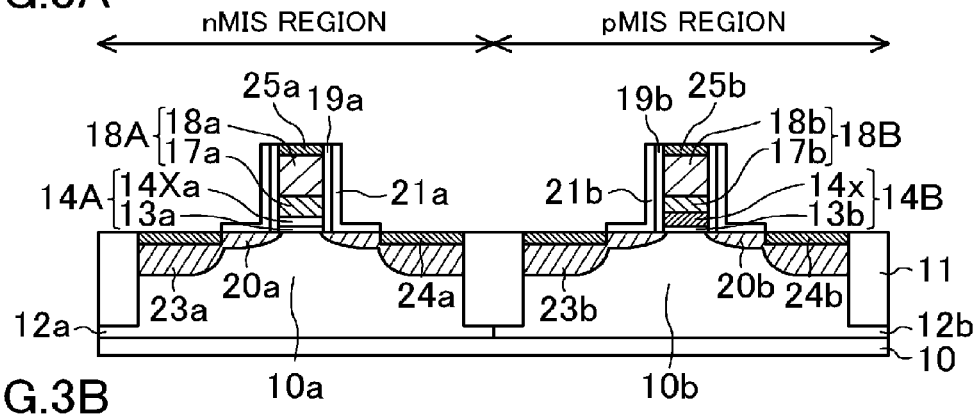
FIGS. 3A-3C sequentially show steps for fabricating the semiconductor device of the first embodiment of the present disclosure in cross-sectional views taken in the gate length direction.

As shown in FIG. 3A, the first and second outer sidewalls (the silicon nitride film) 22a, 22b are removed by, for example, dry etching or wet etching, with high selectivity to the first and second inner sidewalls (the silicon oxide film) 21a, 21b.

Then, a natural oxide film (not shown) formed on the surfaces of the deep n-type and p-type source/drain regions 23a, 23b, and a natural oxide film (not shown) formed on the surfaces of the first and second silicon films 18a, 18b are removed. Then, a 10 nm thick metal film made of nickel (not shown) is deposited on the entire surface of the semiconductor substrate 10 by, for example, sputtering. Then, Si in the deep n-type and p-type source/drain regions 23a, 23b and Ni in the metal film are reacted, and Si in the first and second silicon films 18a, 18b and Ni in the metal film are reacted by, for example, a first rapid thermal annealing (RTA) in a nitrogen atmosphere at 320° C. Thus, 20 nm thick first and second metal silicide films 24a, 24b made of nickel silicide are formed in upper portions of the deep n-type and p-type source/drain regions 23a, 23b, respectively. Simultaneously, 20 nm thick third and fourth metal silicide films 25a, 25b made of nickel silicide are formed in upper portions of the first and second silicon films 18a, 18b, respectively. Then, the metal film remaining on the isolation region 11, the first and second offset spacers 19a, 19b, the first and second inner sidewalls 21a, 21b, etc. (i.e., unreacted part of the metal film) is removed by, for example, immersion in an etchant made of a mixture of sulfuric acid and a hydrogen peroxide solution. A second RTA is then performed at a temperature higher than the temperature of the first RTA (e.g., 550° C.) to stabilize silicide composition ratios of the first and second metal silicide films 24a, 24b, and the third and fourth metal silicide films 25a, 25b.

Figure 3B:
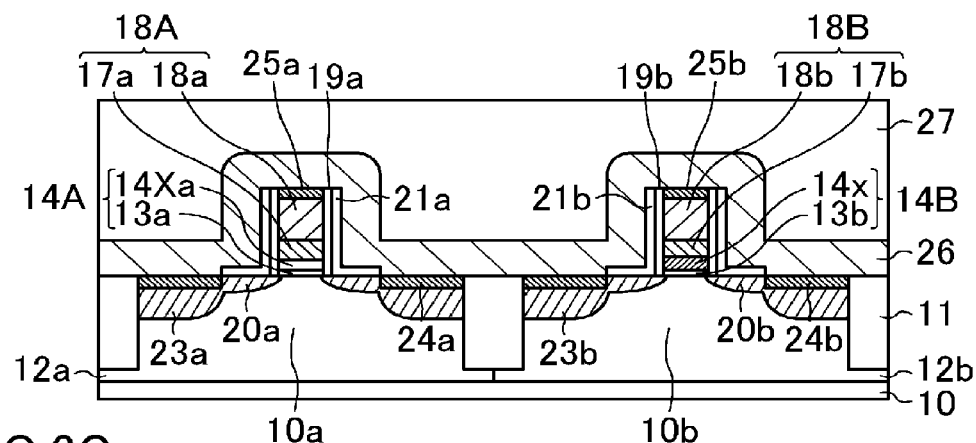

Then, as shown in FIG. 3B, a 50 nm thick insulating film 26 made of a silicon nitride film is deposited on the entire surface of the semiconductor substrate 10 by, for example, plasma CVD. Then, an interlayer insulating film 27 made of a silicon oxide film is deposited on the insulating film 26 by, for example, CVD. Then, a surface of the interlayer insulating film 27 is flattened by, for example, chemical mechanical polishing (CMP).

Figure 3C:
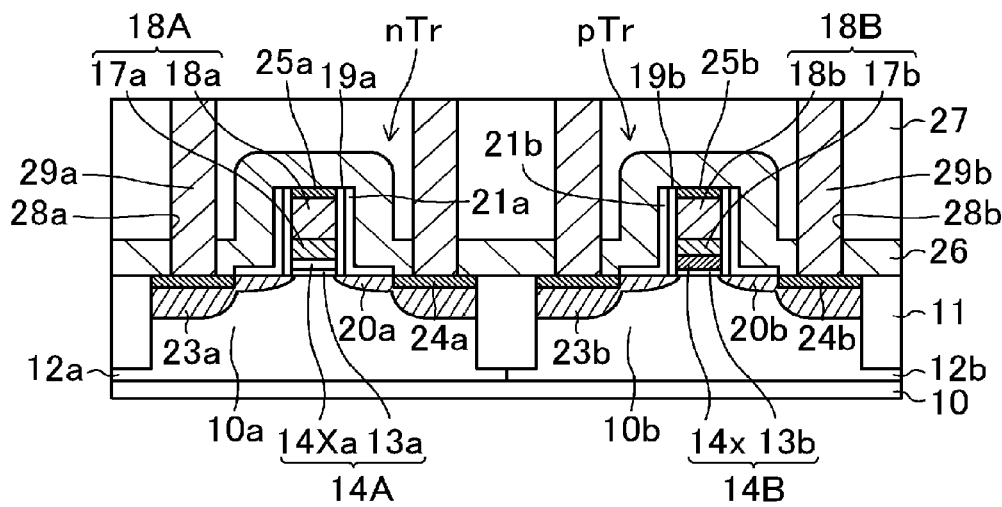

As shown in FIG. 3C, steps of fabricating a semiconductor device including a common MIS transistor are performed. Specifically, first and second contact holes 28a, 28b are formed in the insulating film 26 and the interlayer insulating film 27 to expose upper surfaces of the first and second metal silicide films 24a, 24b by, for example, dry etching. In this step, the etching is once stopped when the insulating film 26 is exposed in the holes, and then the etching is restarted to form the first and second contact holes 28a, 28b. This can reduce over etching of the first and second metal silicide films 24a, 24b. Then, a titanium film and a titanium nitride film are sequentially deposited to form a barrier metal film on the interlayer insulating film 27, and on the bottoms and sidewalls of the first and second contact holes 28a, 28b, by, for example, sputtering or CVD. Then, a conductive film made of tungsten is deposited on the interlayer insulating film 27 by for example, CVD, to fill the first and second contact holes 28a, 28b. Then, the conductive film and the barrier metal film outside the first and second contact holes 28a, 28b are sequentially removed. In this way, first and second contact plugs 29a, 29b are formed in the first and second contact holes 28a, 28b, respectively, by burring the conductive film in the first and second contact holes 28a, 28b with the barrier metal film interposed therebetween. Then, interconnects (not shown) electrically connected to the first and second contact plugs 29a, 29b are formed on the interlayer insulating film 27.

As described above, the semiconductor device of the present embodiment can be fabricated. Specifically, the semiconductor device including the n-type MIS transistor nTr having the first gate insulating film 14A including the first high dielectric constant film 14Xa containing nitrogen, and a p-type MIS transistor pTr having the second gate insulating film 14B including the second high dielectric constant film 14x which does not contain nitrogen, but contains Al can be fabricated.

The structure of the semiconductor device of the first embodiment of the present disclosure will be described with reference to FIG. 3C.

The n-type MIS transistor nTr is formed in the nMIS region of the semiconductor substrate 10. The p-type MIS transistor pTr is formed in the pMIS region of the semiconductor substrate 10.

The n-type MIS transistor nTr includes, as shown in FIG. 3C, the first gate insulating film 14A formed on the first active region 10a of the semiconductor substrate 10, the first gate electrode 18A formed on the first gate insulating film 14A, the first offset spacers 19a formed on the side surfaces of the first gate electrode 18A, the first inner sidewalls 21a, each of which has an L-shaped cross section, and is formed on the side surface of the first gate electrode 18A with the first offset spacer 19a interposed therebetween, the shallow n-type source/drain regions 20a formed in the first active region 10a below the sides of the first gate electrode 18A, and the deep n-type source/drain regions 23a formed in the first active region 10a outside the first inner sidewalls 21a, the first metal silicide film 24a formed on the deep n-type source/drain regions 23a, and the third metal silicide film 25a formed on the first gate electrode 18A.

The p-type MIS transistor pTr includes, as shown in FIG. 3C, the second gate insulating film 14B formed on the second active region 10b of the semiconductor substrate 10, the second gate electrode 18B formed on the second gate insulating film 14B, the second offset spacers 19b formed on the side surfaces of the second gate electrode 18B, the second inner sidewalls 21b, each of which has an L-shaped cross section, and is formed on the side surface of the second gate electrode 18B with the second offset spacer 19b interposed therebetween, the shallow p-type source/drain regions 20b formed in the second active region 10b below the sides of the second gate electrode 18B, the deep p-type source/drain regions 23b formed in the second active region 10b outside the second inner sidewalls 21b, the second metal silicide film 24b formed on the deep p-type source/drain regions 23b, and the fourth metal silicide film 25b formed on the second gate electrode 18B.

The insulating film 26 is formed on the semiconductor substrate 10 to cover the first and second gate electrodes 18A, 18B, the first and second offset spacers 19a, 19b, and the first and second inner sidewalls 21a, 21b. The insulating film 26 is formed in contact with the surfaces of the first and second inner sidewalls 21a, 21b. The interlayer insulating film 27 is formed on the insulating film 26.

The first and second contact plugs 29a, 29b which penetrate the interlayer insulating film 27 and the insulating film 26, and are connected to the first and second metal silicide films 24a, 24b are formed in the insulating film 26 and the interlayer insulating film 27.

The first gate insulating film 14A includes the first underlying film 13a formed on the first active region 10a, and the first high dielectric constant film 14Xa formed on the first underlying film 13a. The second gate insulating film 14B includes the second underlying film 13b formed on the second active region 10b, and the second high dielectric constant film 14x formed on the second underlying film 13b.

The first high dielectric constant film 14Xa contains nitrogen, while the second high dielectric constant film 14x does not contain nitrogen. The first high dielectric constant film 14Xa has a higher nitrogen concentration than the second high dielectric constant film 14x. The nitrogen concentration in the first high dielectric constant film 14Xa gradually decreases from the top to the bottom.

The first high dielectric constant film 14Xa does not contain the first adjusting metal (Al), while the second high dielectric constant film 14x contains the first adjusting metal (Al). The Al concentration in the second high dielectric constant film 14x gradually decreases from the top to the bottom.

The first gate electrode 18A includes the first metal film 17a formed on the first gate insulating film 14A, and the first silicon film 18a formed on the first metal film 17a. The second gate electrode 18B includes the second metal film 17b formed on the second gate insulating film 14B, and the second silicon film 18b formed on the second metal film 17b.

Figure 10:
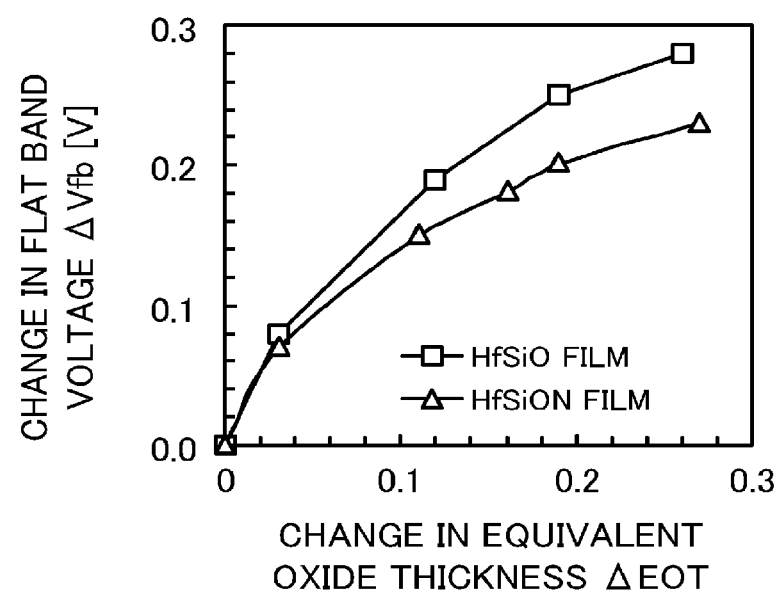
FIG. 10 is a graph illustrating a relationship between a change in flat band voltage and a change in equivalent oxide thickness when the thickness of the Al cap film is varied, and Al is diffused into an HfSiO film and an HfSiON film.
Figure 11A:
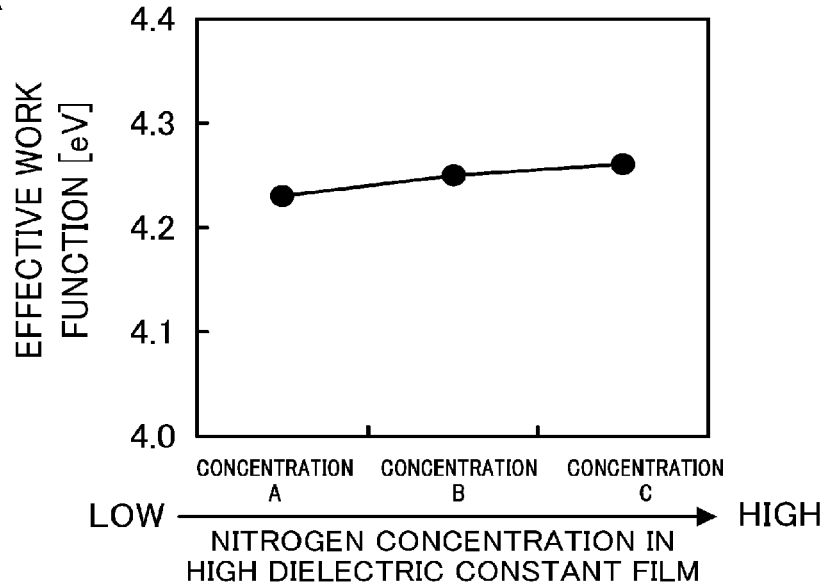
FIG. 11A is a graph illustrating a relationship between a nitrogen concentration in a high dielectric constant film of a gate insulating film and an effective work function of an n-type MIS transistor.
Figure 11B:
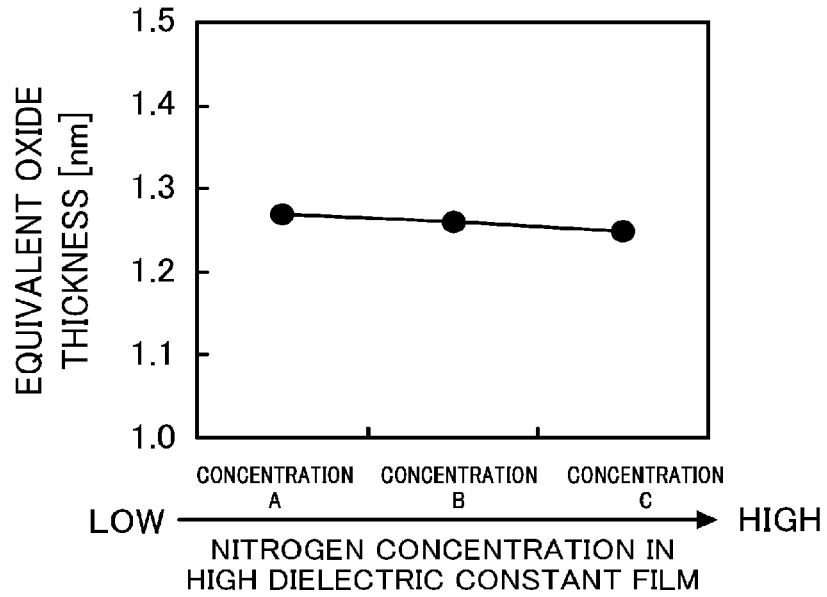
FIG. 11B is a graph illustrating a relationship between the nitrogen concentration in the high dielectric constant film of the gate insulating film and an equivalent oxide thickness of the high dielectric constant film.

According to the present embodiment, the first high dielectric constant film 14Xa containing nitrogen, and the second high dielectric constant film 14x which does not contain nitrogen, but contains Al can be formed. Since the second high dielectric constant film 14x does not contain nitrogen, a decrease in amount of the first adjusting metal (Al) diffused into the second high dielectric constant film 14b can effectively be reduced. This can reduce the increase in equivalent oxide thickness of the second gate insulating film 14B, and can increase the shift amount of the flat band voltage as shown in FIG. 10, thereby increasing the effective work function of the p-type MIS transistor pTr, and providing the p-type MIS transistor pTr with a low threshold voltage. Even when the nitrogen concentration in the first high dielectric constant film 14Xa is higher than the nitrogen concentration in the second high dielectric constant film 14x, the effective work function of the n-type MIS transistor nTr is not reduced as shown in FIG. 11A, and the equivalent oxide thickness of the first high dielectric constant film 14Xa is not increased as shown in FIG. 11B. This can provide the n-type MIS transistor nTr with a low threshold voltage without increasing the equivalent oxide thickness of the first gate insulating film 14A.

Thus, the increase in equivalent oxide thickness of the second gate insulating film 14B can be reduced, and the effective work function of the p-type MIS transistor pTr can be increased, thereby providing the n-type and p-type MIS transistors nTr, pTr with low threshold voltages.

In addition, the first high dielectric constant film 14Xa contains nitrogen, and can reduce crystallization of the first high dielectric constant film 14Xa, thereby reducing a decrease in reliability. Further, the first high dielectric constant film 14Xa containing nitrogen can reduce the equivalent oxide thickness of the first high dielectric constant film 14Xa. The second high dielectric constant film 14x does not contain nitrogen, but contains Al, and can reduce the crystallization of the second high dielectric constant film 14x, thereby reducing a decrease in reliability. Specifically, like nitrogen, Al can reduce the crystallization of the high dielectric constant film.

In the present embodiment, as shown in FIG. 1B, the high dielectric constant film 14 is deposited on the underlying film 13, and then the first adjusting metal film 15 is deposited on the high dielectric constant film 14. However, the present disclosure is not limited to this example. For example, annealing may be performed in a nitrogen atmosphere at 1000° C. after the high dielectric constant film is deposited and before the first adjusting metal film is deposited. The annealing can make the high dielectric constant film dense. In a thermal treatment performed after the annealing (specifically, a thermal treatment for activating the n-type and p-type impurities contained in the deep n-type and p-type source/drain regions), Al contained in the first adjusting metal film can effectively be diffused into the dense high dielectric constant film, thereby effectively increasing the effective work function of the p-type MIS transistor.

In the present embodiment, the first adjusting metal contained in the first adjusting metal film is diffused into the high dielectric constant film formed below the first adjusting metal film by the thermal treatment performed for activating the n-type and p-type impurities contained in the deep n-type and p-type source/drain regions. However, the present disclosure is not limited to this example. Specifically, the first adjusting metal contained in the first adjusting metal film may possibly be diffused into the high dielectric constant film formed below the first adjusting metal film in a thermal treatment at a high temperature (e.g., 600° C.) performed in the fabrication of the semiconductor device. The thermal treatment may be, for example, a thermal treatment in depositing a silicon film (see FIG. 2A of the first embodiment, FIG. 5A of a second embodiment, and FIG. 7A of a third embodiment), a thermal treatment in depositing an insulating film made of a silicon nitride film as a material of the outer sidewalls (see FIG. 2D of the first embodiment), or annealing for diffusing the second adjusting metal contained in the second adjusting metal film into the high dielectric constant film formed below the second adjusting metal film (see FIG. 4C of a second embodiment).

Second Embodiment

A semiconductor device and a method for fabricating the same according to a second embodiment of the present disclosure will be described with reference to the drawings. In the second embodiment, differences between the second embodiment and the first embodiment will mainly be described, and common features will be omitted as appropriate.

The method for fabricating the semiconductor device of the second embodiment of the present disclosure will be described with reference to FIGS. 4A-4D, and FIGS. 5A-5C. FIGS. 4A-5C show the steps of fabricating the semiconductor device of the second embodiment of the present disclosure in cross-sectional views taken in a gate length direction. In FIGS. 4A-5C, the same components as those of the first embodiment will be indicated by the same reference characters as those of the first embodiment shown in FIGS. 1A-3C.

Figure 4A:
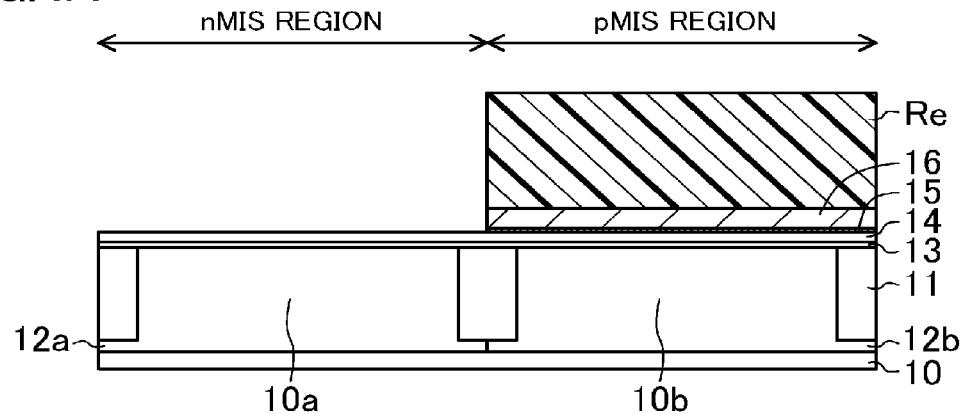
FIGS. 4A-4D sequentially show steps for fabricating a semiconductor device of a second embodiment of the present disclosure in cross-sectional views taken in the gate length direction.

Steps similar to those of the first embodiment shown in FIGS. 1A-1C are performed to obtain the structure shown in FIG. 4A (i.e., a structure similar to the structure shown in FIG. 1C).

Figure 4B:
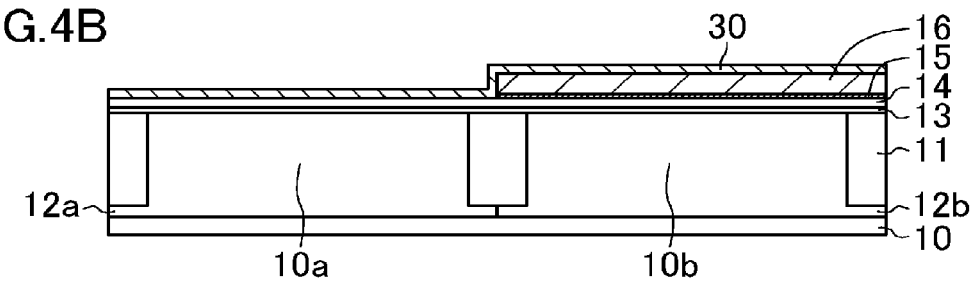

Then, a resist pattern Re is removed as shown in FIG. 4B.

In this way, a first adjusting metal film 15 and a protective film 16 are sequentially formed on part of a high dielectric constant film 14 in the pMIS region (including a first part of the high dielectric constant film 14 on the second active region 10b).

Then, a 2 nm thick second adjusting metal film 30 is deposited on the high dielectric constant film 14 in the nMIS region and the protective film 16 by, for example, sputtering or ALD. The second adjusting metal film 30 contains a second adjusting metal, such as La, etc. The second adjusting metal film 30 may be made of, for example, lanthanum oxide ($La_2O_3$).

In this way, the second adjusting metal film 30 is formed on part of the high dielectric constant film 14 in the nMIS region (including a second part of the high dielectric constant film 14 on the first active region 10a).

Figure 4C:
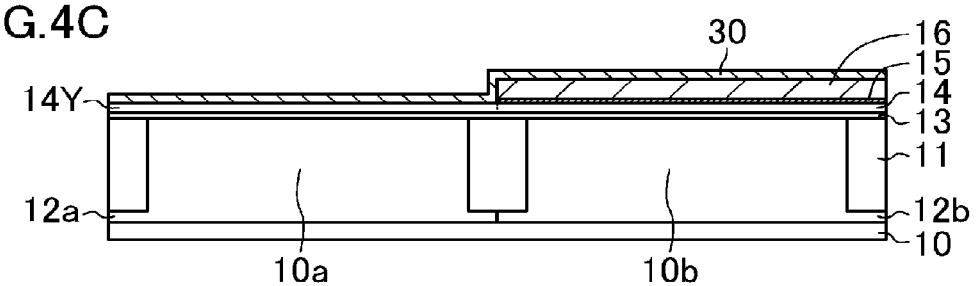

Then, as shown in FIG. 4C, the second adjusting metal (La) contained in the second adjusting metal film 30 is diffused into the part of the high dielectric constant film 14 in the nMIS region by, for example, annealing at 700° C. In this step, La is diffused into the high dielectric constant film 14 in the nMIS region in such a manner that an La concentration gradually decreases from the top to the bottom, and La reaches an interface between the underlying film 13 in the nMIS region and the high dielectric constant film 14 in the nMIS region. Since the protective film 16 of a predetermined thickness (e.g., 3 nm) or thicker is formed on the first adjusting metal film 15, diffusion of La contained in the second adjusting metal film 30 into the first adjusting metal film 15 can be prevented. Thus, as described later, the diffusion of La from a first adjusting metal film 15b into a second high dielectric constant film 14b in a thermal treatment (a thermal treatment for diffusing n-type and p-type impurities into n-type and p-type source/drain regions) can be prevented.

In this way, an La-containing high dielectric constant film 14Y is formed on the underlying film 13 in the nMIS region. The La concentration in the high dielectric constant film 14Y gradually decreases from the top to the bottom. An La-free high dielectric constant film 14 is formed on the underlying film 13 in the pMIS region.

Figure 4D:
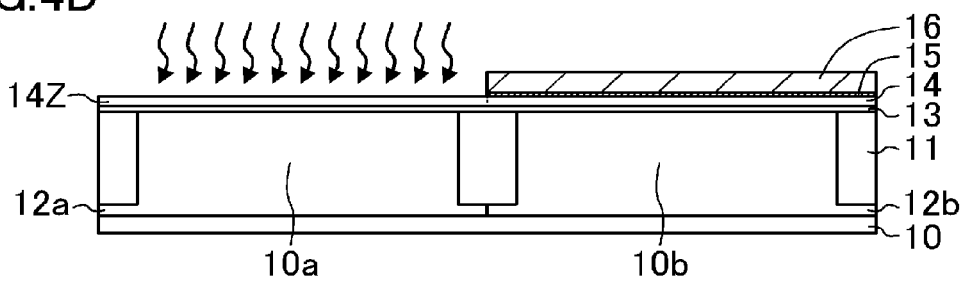

Then, as shown in FIG. 4D, the second adjusting metal film 30 is removed by, for example, wet etching with high selectivity to the La-containing high dielectric constant film 14Y.

Using the protective film 16 as a mask, nitrogen (first nitrogen) is introduced in the La-containing high dielectric constant film 14Y (including a second part of the high dielectric constant film 14Y on the first active region 10a) by, for example, a nitrogen plasma treatment. In this step, nitrogen is introduced in the La-containing high dielectric constant film 14Y in such a manner that a nitrogen concentration gradually decreases from the top to the bottom, and nitrogen reaches the semiconductor substrate 10 in the nMIS region. Since the protective film 16 is formed on the first adjusting metal film 15, nitrogen is not introduced in the first adjusting metal film 15.

In this way, a high dielectric constant film 14Z containing La and nitrogen is formed on the underlying film 13 in the nMIS region. The La concentration in the high dielectric constant film 14Z gradually decreases from the top to the bottom. The nitrogen concentration in the high dielectric constant film 14Z gradually decreases from the top to the bottom. The high dielectric constant film 14 which does not contain La and nitrogen is formed on the underlying film 13 in the pMIS region.

Figure 5A:
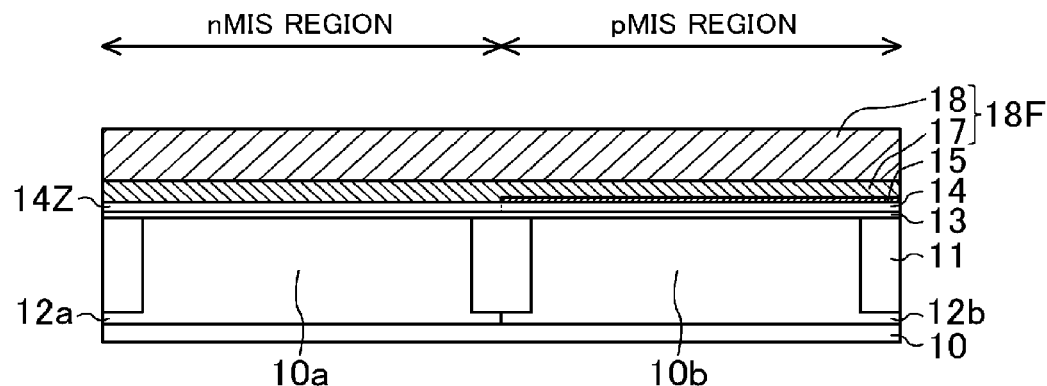
FIGS. 5A-5C sequentially show steps for fabricating the semiconductor device of the second embodiment of the present disclosure in cross-sectional views taken in the gate length direction.

As shown in FIG. 5A, a step similar to that of the first embodiment shown in FIG. 2A is performed. Specifically, the protective film 16 is removed, and then a gate electrode film 18F including a metal film 17 and a silicon film 18 is formed on the high dielectric constant film 14Z containing La and nitrogen, and the first adjusting metal film 15.

Figure 5B:
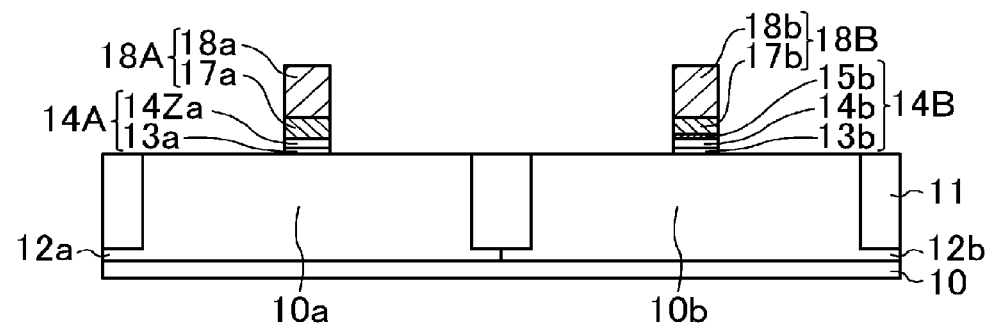

As shown in FIG. 5B, a step similar to that of the first embodiment shown in FIG. 2B is performed. Specifically, the gate insulating film 18F, the first adjusting metal film 15, the high dielectric constant film 14Z containing La and nitrogen, the high dielectric constant film 14 which does not contain La and nitrogen, and the underlying film 13 are sequentially patterned. Thus, a first gate insulating film 14A including a first underlying film 13a and a first high dielectric constant film 14Za containing La and nitrogen, and a first gate electrode 18A are sequentially formed on the first active region 10a. Simultaneously, a second gate insulating film 14B including a second underlying film 13b, a second high dielectric constant film 14b which does not contain La and nitrogen, and a first adjusting metal film 15b, and a second gate electrode 18B are sequentially formed on the second active region 10b.

Then, a step similar to that of the first embodiment shown in FIG. 2C is performed. Specifically, first and second offset spacers 19a, 19b are formed on side surfaces of the first and second gate electrodes 18A, 18B. Then, shallow n-type and p-type source/drain regions 20a, 20b are formed in the first and second active regions 10a, 10b below the sides of the first and second gate electrodes 18A, 18B, respectively.

Then, a step similar to that of the first embodiment shown in FIG. 2D is performed. Specifically, first and second sidewalls are formed on the side surfaces of the first and second gate electrodes 18A, 18B with the first and second offset spacers 19a, 19b interposed therebetween. Then, deep n-type and p-type source/drain regions 23a, 23b are formed in the first and second active regions 10a, 10b outside the first and second sidewalls. Then, the n-type and p-type impurities contained in the deep n-type and p-type source/drain regions 23a, 23b are activated by a thermal treatment. Simultaneously, the first adjusting metal (Al) contained in the first adjusting metal film 15b is diffused into the second high dielectric constant film 14b which does not contain La and nitrogen. In this step, Al is diffused into the second high dielectric constant film 14b to make the Al concentration gradually decrease from the top to the bottom. Since the second high dielectric constant film 14b does not contain nitrogen, Al can be diffused into the second high dielectric constant film 14b while effectively reducing the decrease in amount of Al diffused into the second high dielectric constant film 14b. Further, since La contained in the second adjusting metal film 30 is not diffused into the first adjusting metal film 15 in the annealing as described above, La is not diffused from the first adjusting metal film 15b into the second high dielectric constant film 14b. Thus, a second high dielectric constant film 14x containing Al (see FIG. 5C described later) is formed between the second underlying film 13b and the second gate electrode 18B.

In this way, the second gate insulating film 14B including the second underlying film 13b, and the second high dielectric constant film 14x which does not contain La and nitrogen, but contains Al is formed. The Al concentration in the second high dielectric constant film 14x gradually decreases from the top to the bottom. The thickness of the second high dielectric constant film 14x is the sum of the thickness of the second high dielectric constant film 14b and the thickness of the first adjusting metal film 15b.

Figure 5C:
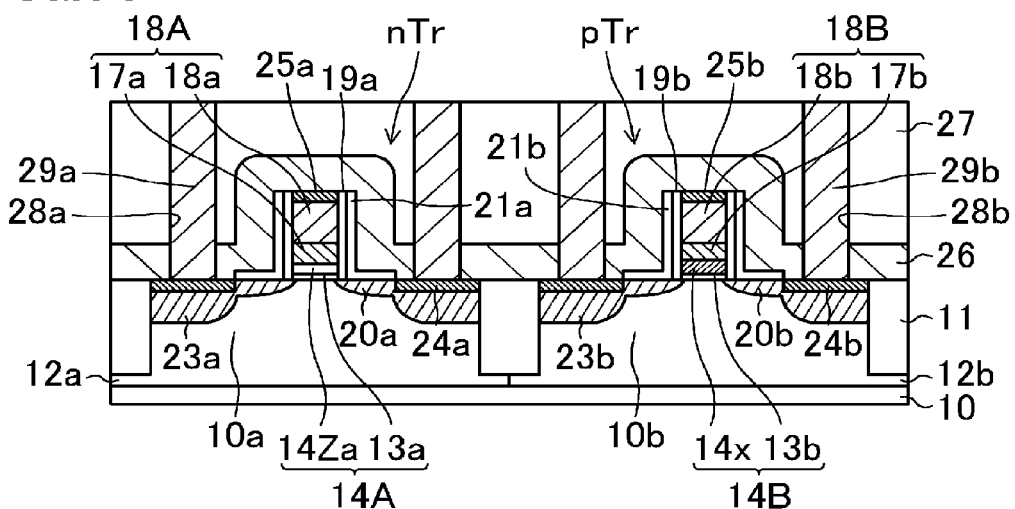

Then, steps similar to those of the first embodiment shown in FIGS. 3A-3C are sequentially performed to obtain the structure shown in FIG. 5C.

In this way, the semiconductor device of the present embodiment is fabricated. Specifically, a semiconductor device including an n-type MIS transistor nTr having the first gate insulating film 14A including the first high dielectric constant film 14Za containing La and nitrogen, and a p-type MIS transistor pTr having the second gate insulating film 14B including the second high dielectric constant film 14x which does not contain La and nitrogen, but contains Al.

The present embodiment is different from the first embodiment in the following points.

In the first embodiment, the first high dielectric constant film 14Xa in the first gate insulating film 14A contains nitrogen. In the present embodiment, the first high dielectric constant film 14Za in the first gate insulating film 14A contains La and nitrogen.

In present embodiment, the first high dielectric constant film 14Za containing La and nitrogen, and the second high dielectric constant film 14X which does not La and nitrogen, but contains Al can be formed. Since the second high dielectric constant film 14X does not contain nitrogen, the second embodiment can provide advantages similar to those of the first embodiment.

Further, La can be diffused into the first high dielectric constant film 14Za. This can increase the shift amount of the flat band voltage, and can increase the effective work function of the n-type MIS transistor nTr, thereby providing the n-type MIS transistor nTr with a low threshold voltage.

In the second embodiment, La has been described as the second adjusting metal contained in the second adjusting metal film 30. However, the present disclosure is not limited to this example.

Third Embodiment

A semiconductor device and a method for fabricating the same according to a third embodiment of the present disclosure will be described with reference to the drawings. In the third embodiment, differences between the third embodiment and the first embodiment will mainly be described, and common features will be omitted as appropriate.

The method for fabricating the semiconductor device of the third embodiment of the present disclosure will be described with reference to FIGS. 6A-6D and FIGS. 7A-7C. FIGS. 6A-7C sequentially show the steps of fabricating the semiconductor device of the third embodiment of the present disclosure in cross-sectional views taken in a gate length direction. In FIGS. 6A-7C, the same components as those of the first embodiment will be indicated with the same reference characters as those of the first embodiment shown in FIGS. 1A-3C.

A step similar to that of the first embodiment shown in FIG. 1A is performed to obtain a structure similar to the structure shown in FIG. 1A.

Figure 6A:
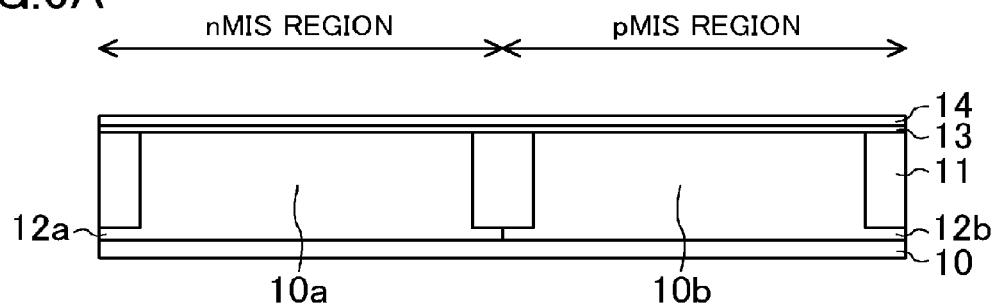
FIGS. 6A-6D sequentially show steps for fabricating a semiconductor device of a third embodiment of the present disclosure in cross-sectional views taken in the gate length direction.

Then, as shown in FIG. 6A, a surface of the semiconductor substrate 10 is cleaned with, for example, diluted hydrofluoric acid. Then, a 0.8 nm-1 nm thick underlying film 13 made of a silicon oxide film or a silicon oxynitride film is formed on the first active region 10a and the second active region 10b by, for example, ISSG oxidation. Then, a 2 nm thick nitrogen-free high dielectric constant film 14 is deposited on the underlying film 13 by, for example, MOCVD, ALD, etc.

Figure 6B:
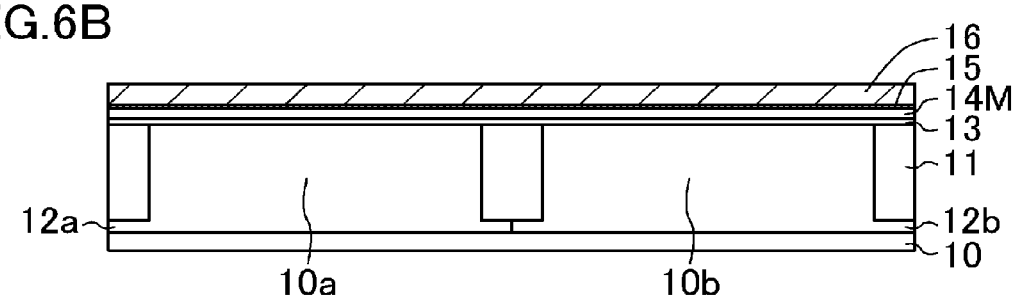

Then, as shown in FIG. 6B, nitrogen (second nitrogen) is introduced in a high dielectric constant film 14 (including a second part of the high dielectric constant film 14 on the first active region 10a) by, for example, a first nitrogen plasma treatment. In this step, nitrogen is introduced in the high dielectric constant film 14 to make the nitrogen concentration gradually decrease from the top to the bottom.

In this way, a nitrogen-containing high dielectric constant film 14M is formed on the underlying film 13. The nitrogen concentration in the high dielectric constant film 14M gradually decreases from the top to the bottom. The high dielectric constant film 14M of the present embodiment shown in FIG. 6B has a lower nitrogen concentration than the high dielectric constant film 14X of the first embodiment shown in FIG. 1D, and the high dielectric constant film 14Z of the second embodiment shown in FIG. 4D.

Then, annealing is performed in a nitrogen atmosphere at 1000° C. This can make the high dielectric constant film 14M dense. Simultaneously, nitrogen introduced in the high dielectric constant film 14M, but is not bonded completely can be removed.

Then, a 0.3 nm thick first adjusting metal film 15 made of Al or $Al_2O_3$ is deposited on the nitrogen-containing high dielectric constant film 14M by, for example, sputtering.

Then, a 5 nm thick protective film 16 made of TiN is deposited on the first adjusting metal film 15 by, for example, CVD, ALD, sputtering, etc.

Figure 6C:
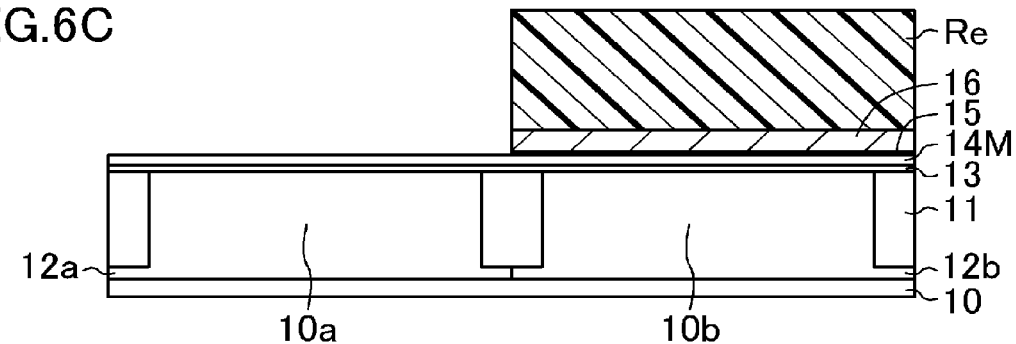

As shown in FIG. 6C, a resist pattern Re which exposes the nMIS region, and covers the pMIS region is formed on the protective film 16 by lithography. Then, the protective film 16 and the first adjusting metal film 15 are sequentially removed from the nMIS region by wet etching with high selectivity to the nitrogen-containing high dielectric constant film 14M.

Figure 6D:
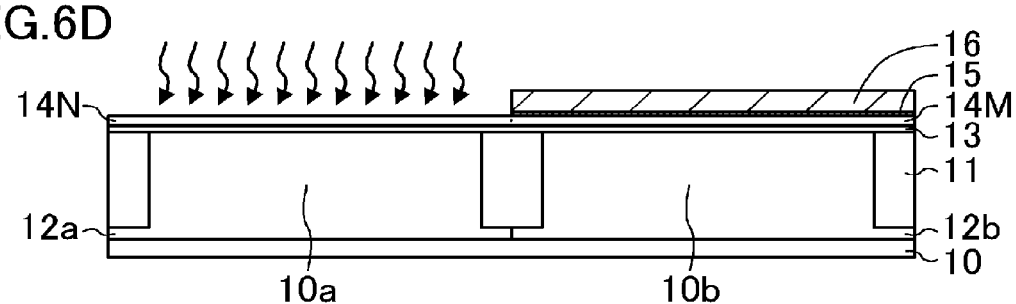

The resist pattern Re is then removed as shown in FIG. 6D.

In this way, the first adjusting metal film 15 and the protective film 16 are sequentially formed on part of the nitrogen-containing high dielectric constant film 14M in the pMIS region (including a first part of the high dielectric constant film 14M on the second active region 10b).

Using the protective film 16 as a mask, nitrogen (first nitrogen) is introduced in the part of the high dielectric constant film 14M in the nMIS region by a second nitrogen plasma treatment. In this step, nitrogen is introduced in the high dielectric constant film 14M in the nMIS region in such a manner that the nitrogen concentration gradually decreases from the top to the bottom, and nitrogen reaches the semiconductor substrate 10 in the nMIS region. Since the protective film 16 is formed on the first adjusting metal film 15, introduction of nitrogen in the first adjusting metal film 15 can be prevented.

In this way, a high dielectric constant film 14N containing nitrogen (second nitrogen and first nitrogen) is formed on the underlying film 13 in the nMIS region. The nitrogen concentration in the high dielectric constant film 14N gradually decreases from the top to the bottom. A high dielectric constant film 14M containing nitrogen (second nitrogen), and having a nitrogen concentration lower than the high dielectric constant film 14N is formed on the underlying film 13 in the pMIS region. The nitrogen concentration in the high dielectric constant film 14M gradually decreases from the top to the bottom.

Figure 7A:
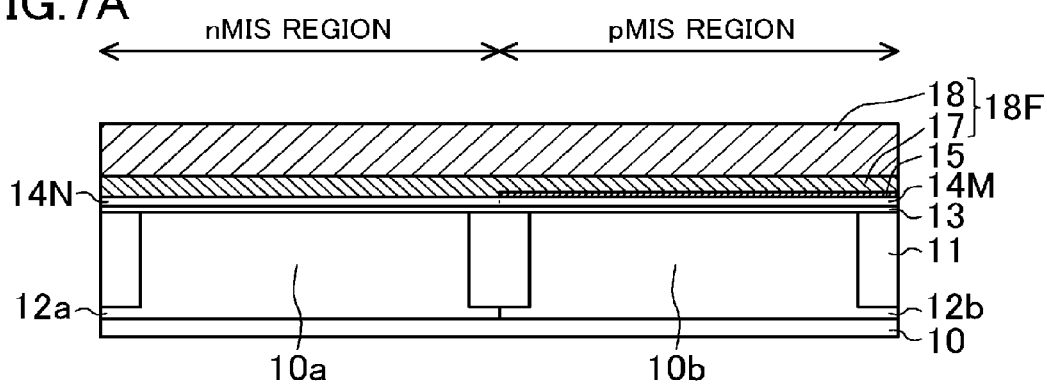
FIGS. 7A-7C sequentially show steps for fabricating the semiconductor device of the third embodiment of the present disclosure in cross-sectional views taken in the gate length direction.

As shown in FIG. 7A, a step similar to that of the first embodiment shown in FIG. 2A is performed. Specifically, the protective film 16 is removed, and then a gate electrode film 18F including a metal film 17 and a silicon film 18 is formed on the nitrogen-containing high dielectric constant film 14N and the first adjusting metal film 15.

Figure 7B:
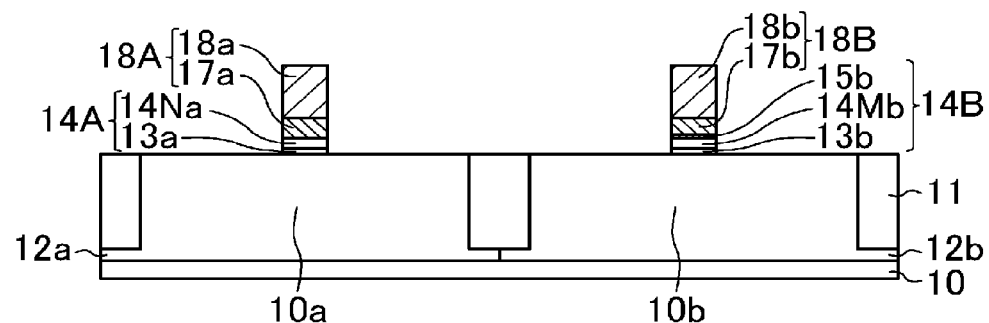

Then, as shown in FIG. 7B, a step similar to that of the first embodiment shown in FIG. 2B is performed. Specifically, the gate electrode film 18F, the first adjusting metal film 15, the nitrogen-containing high dielectric constant film 14N, the high dielectric constant film 14M containing nitrogen, and having a lower nitrogen concentration than the high dielectric constant film 14N, and the underlying film 13 are sequentially patterned. Thus, a first gate insulating film 14A including a first underlying film 13a and a first nitrogen-containing high dielectric constant film 14Na, and a first gate electrode 18A are sequentially formed on the first active region 10a. Simultaneously, a second gate insulating film 14B including a second underlying film 13b, a second high dielectric constant film 14Mb containing nitrogen, and having a lower nitrogen concentration than the first high dielectric constant film 14Na, and a first adjusting metal film 15b, and a second gate electrode 18B are sequentially formed on the second active region 10b.

Then, a step similar to that of the first embodiment shown in FIG. 2C is performed. Specifically, first and second offset spacers 19a, 19b are formed on side surfaces of the first and second gate electrodes 18A, 18B. Then, shallow n-type and p-type source/drain regions 20a, 20b are formed in the first and second active regions 10a, 10b below the sides of the first and second gate electrodes 18A, 18B.

Then, a step similar to that of the first embodiment shown in FIG. 2D is performed. Specifically, first and second sidewalls are formed on the side surfaces of the first and second gate electrodes 18A, 18B with the first and second offset spacers 19a, 19b interposed therebetween. Then, deep n-type and p-type source/drain regions 23a, 23b are formed in the first and second active regions 10a, 10b outside the first and second sidewalls. Then, the n-type and p-type impurities contained in the deep n-type and p-type source/drain regions 23a, 23b are activated by a thermal treatment. Simultaneously, a first adjusting metal (Al) contained in the first adjusting metal film 15b is diffused into the second nitrogen-containing high dielectric constant film 14Mb. In this step, Al is diffused into the second high dielectric constant film 14Mb to make the Al concentration gradually decrease from the top to the bottom. Since the second high dielectric constant film 14Mb has a lower nitrogen concentration than the first high dielectric constant film 14Na, Al can be diffused into the second high dielectric constant film 14Mb while reducing the decrease in amount of Al diffused into the second high dielectric constant film 14Mb. Thus, the second high dielectric constant film 14Mx containing Al (see FIG. 7C described later) is formed between the second underlying film 13b and the second gate electrode 18B.

In this way, the second gate insulating film 14B including the second underlying film 13b, and the second high dielectric constant film 14Mx containing nitrogen and Al, and having a lower nitrogen concentration than the first high dielectric constant film 14Na is formed. The nitrogen concentration in the second high dielectric constant film 14Mx gradually decreases from the top to the bottom. The Al concentration in the second high dielectric constant film 14Mx gradually decreases from the top to the bottom. The thickness of the second high dielectric constant film 14Mx is the sum of the thickness of the second high dielectric constant film 14Mb and the thickness of the first adjusting metal film 15b.

Figure 7C:
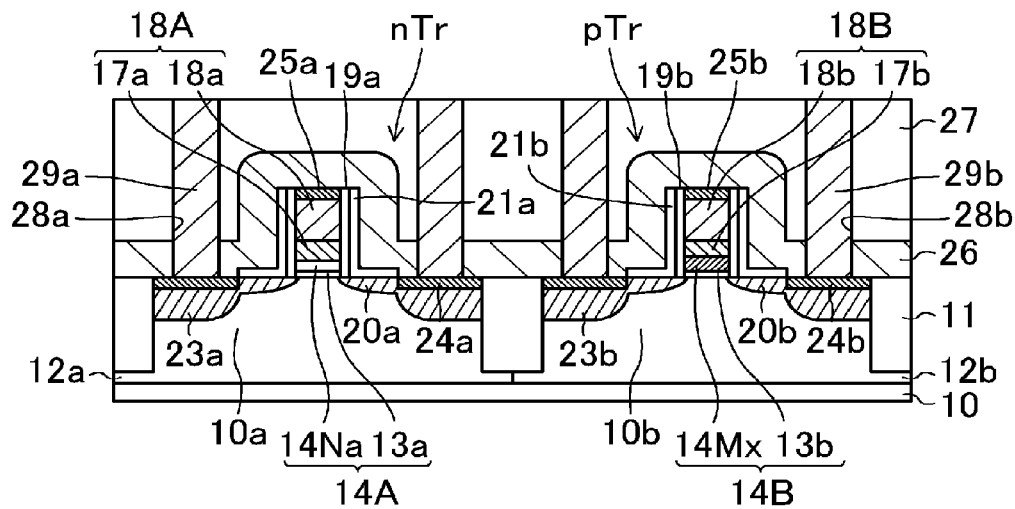

Then, steps similar to those of the first embodiment shown in FIG. 3A-3C are sequentially performed to obtain the structure shown in FIG. 7C.

In this way, the semiconductor device of the present embodiment is fabricated. Specifically, a semiconductor device including an n-type MIS transistor nTr having the first gate insulating film 14A including the first high dielectric constant film 14Na containing nitrogen, and a p-type MIS transistor pTr having the second gate insulating film 14B including the second high dielectric constant film 14Mx containing nitrogen and Al, and having a lower nitrogen concentration than the first high dielectric constant film 14Na is fabricated.

The present embodiment is different from the first embodiment in the following points.

In the first embodiment, the first high dielectric constant film 14Xa in the first gate insulating film 14A contains nitrogen (first nitrogen). In the present embodiment, the first high dielectric constant film 14Na in the first gate electrode 14A contains nitrogen (second nitrogen and first nitrogen). Further, in the first embodiment, the second high dielectric constant film 14X in the second gate electrode 14B does not contain nitrogen, but contains Al. In the present embodiment, the second high dielectric constant film 14Mx in the second gate electrode 14B contains nitrogen and Al.

In the present embodiment, the first high dielectric constant film 14Na containing nitrogen, and the second high dielectric constant film 14Mx containing nitrogen and Al, and having a lower nitrogen concentration than the first high dielectric constant film 14Na can be formed. Thus, the present embodiment can provide advantages similar to those of the first embodiment.

Since the second nitrogen (see FIG. 6B) and the first nitrogen (see FIG. 6D) are sequentially introduced in the first high dielectric constant film 14Na, the nitrogen concentration in the first high dielectric constant film 14Na can precisely be controlled.

In the present embodiment, like the second embodiment, La may be diffused into the first high dielectric constant film. This can increase the shift amount of the flat band voltage, and can increase the effective work function of the n-type MIS transistor, thereby providing the n-type MIS transistor with a low threshold voltage.

Alternative of First Embodiment

A semiconductor device and a method for fabricating the same according to an alternative of the first embodiment of the present disclosure will be described with reference to the drawings. In this alternative, differences between the alternative and the first embodiment will mainly be described, and common features will be omitted as appropriate.

Figure 8A:
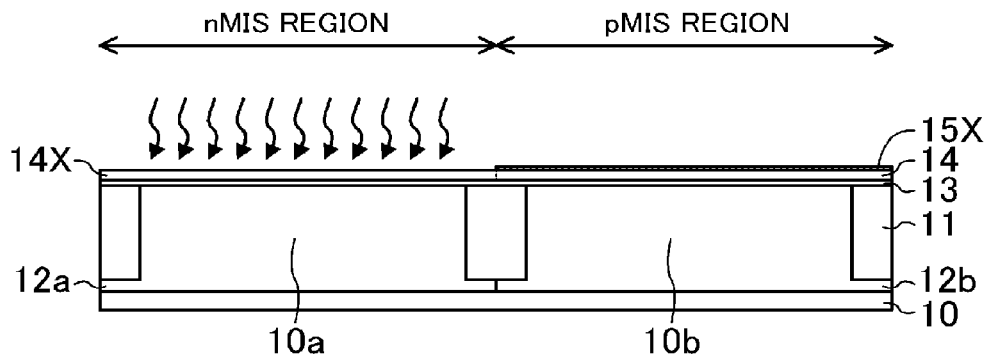
FIGS. 8A-8C sequentially show steps for fabricating a semiconductor device of an alternative of the first embodiment of the present disclosure in cross-sectional views taken in the gate length direction.
Figure 8B:
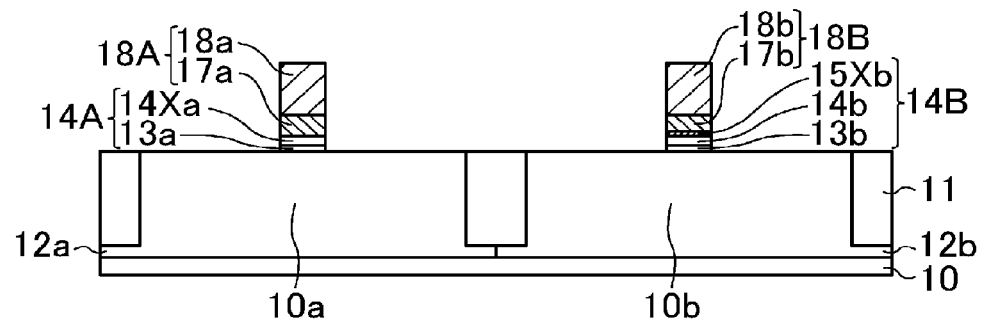
Figure 8C:
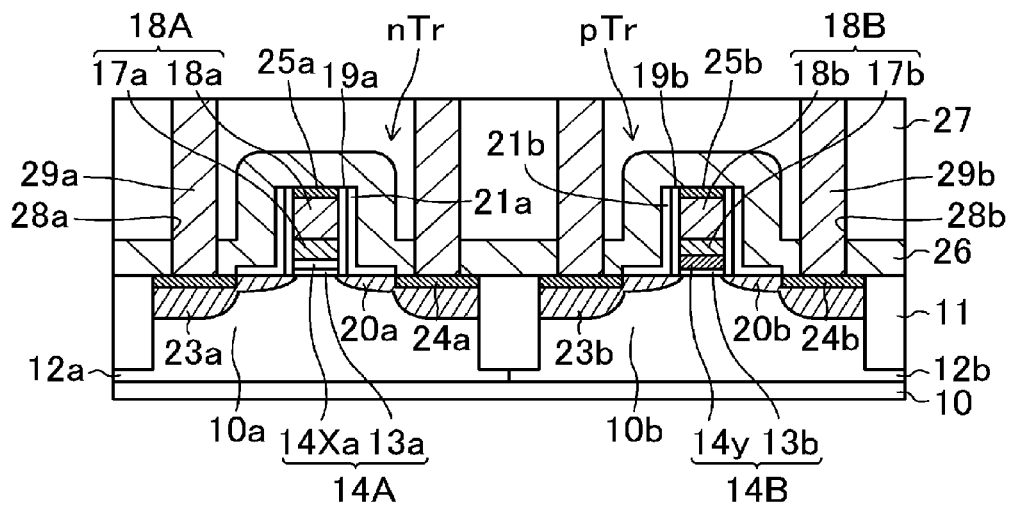
Figure 9A:
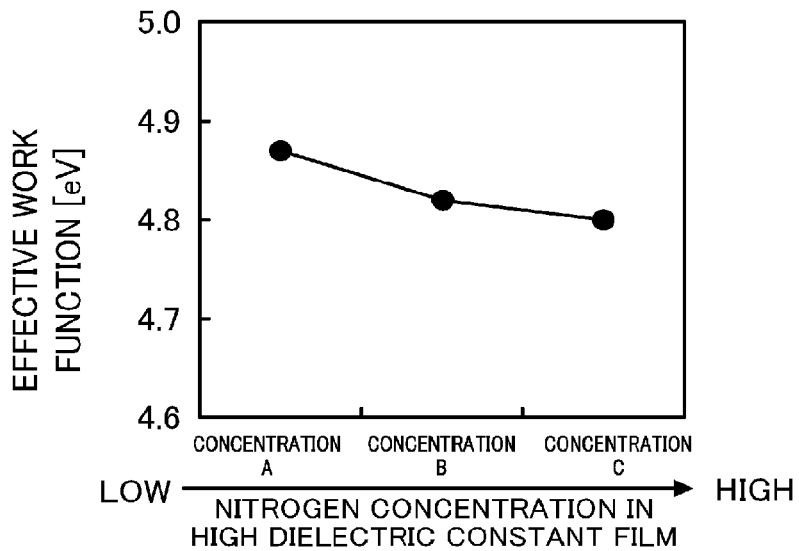
FIG. 9A is a graph illustrating a relationship between a nitrogen concentration in a high dielectric constant film of a gate insulating film and an effective work function of a p-type MIS transistor.
Figure 9B:
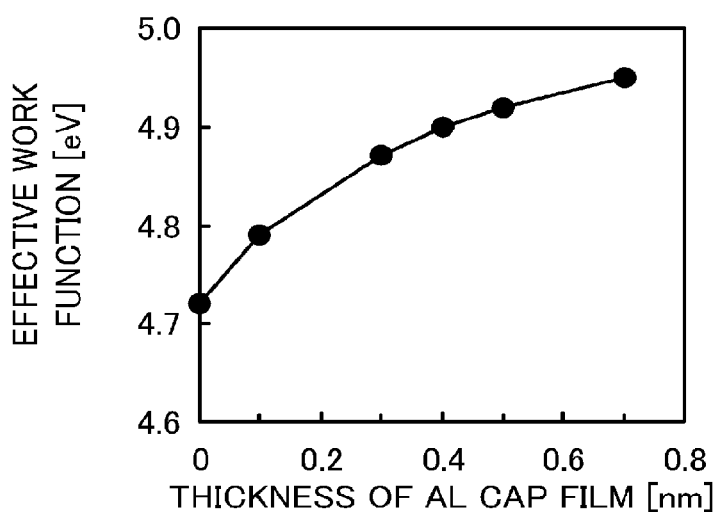
FIG. 9B is a graph illustrating a relationship between a thickness of an Al cap film and the effective work function of the p-type MIS transistor.
Figure 9C:
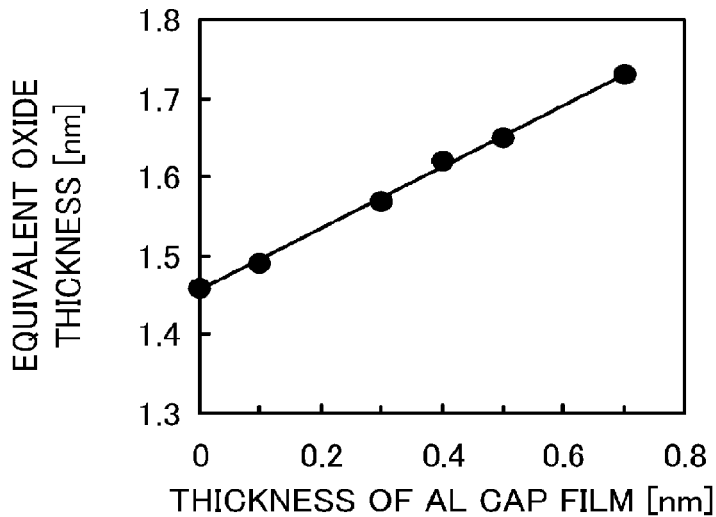
FIG. 9C is a graph illustrating a relationship between the thickness of the Al cap film and an equivalent oxide thickness of the high dielectric constant film of the gate insulating film.

The method for fabricating the semiconductor device according to the alternative of the first embodiment will be described with reference to FIGS. 8A-8C. FIGS. 8A-8C show the steps of fabricating the semiconductor device according to the alternative of the first embodiment in cross-sectional views taken in a gate length direction. In FIGS. 8A-8C, the same components as those of the first embodiment will be indicated by the same reference characters as those of the first embodiment shown in FIGS. 1A-3C.

Steps similar to those of the first embodiment shown in FIGS. 1A-1C are sequentially performed to obtain a structure similar to the structure shown in FIG. 1C.

Then, the resist pattern Re is removed as shown in FIG. 8A. Then, the protective film 16 is removed by wet etching with high selectivity to the first adjusting metal film.

Thus, the first adjusting metal film is formed on part of the high dielectric constant film 14 in the pMIS region (including a first part of the high dielectric constant film 14 on the second active region 10b).

Using the first adjusting metal film as a mask, nitrogen (first nitrogen) is introduced in part of the high dielectric constant film 14 in the nMIS region (including a second part of the high dielectric constant film 14 on the first active region 10a) by, for example, a nitrogen plasma treatment. In this step, nitrogen is introduced in the part of the high dielectric constant film 14 in the nMIS region to make the nitrogen concentration gradually decrease from the top to the bottom. Simultaneously, nitrogen is introduced in a surface region of the first adjusting metal film to form a first adjusting metal film 15x containing nitrogen.

In this way, the nitrogen-containing high dielectric constant film 14X is formed on the underlying film 13 in the nMIS region. Simultaneously, the high dielectric constant film 14 having a lower nitrogen concentration than the high dielectric constant film 14X, and the nitrogen-containing first adjusting metal film 15X are sequentially formed on the underlying film 13 in the pMIS region.

Then, a step similar to that of the first embodiment shown in FIG. 2A is performed. Specifically, a gate electrode film 18F including a metal film 17 and a silicon film 18 is formed on the nitrogen-containing high dielectric constant film 14X, and the nitrogen-containing first adjusting metal film 15X.

Then, as shown in FIG. 8B, a step similar to that of the first embodiment shown in FIG. 2B is performed. Specifically, the gate electrode film 18F, the nitrogen-containing first adjusting metal film 15X, the nitrogen-containing high dielectric constant film 14X, the high dielectric constant film 14 having a lower nitrogen concentration than the high dielectric constant film 14X, and the underlying film 13 are sequentially patterned. Thus, a first gate insulating film 14A including a first underlying film 13a and a first high dielectric constant film 14Xa containing nitrogen, and a first gate electrode 18A are sequentially formed on the first active region 10a. Simultaneously, a second gate insulating film 14B including a second underlying film 13b, a second high dielectric constant film 14b having a lower nitrogen concentration than the first high dielectric constant film 14Xa, and a nitrogen-containing first adjusting metal film 15Xb, and a second gate electrode 18B are sequentially formed on the second active region 10b.

Then, a step similar to that of the first embodiment shown in FIG. 2C is performed. Specifically, first and second offset spacers 19a, 19b are formed on side surfaces of the first and second gate electrodes 18A, 18B. Then, shallow n-type and p-type source/drain regions 20a, 20b are formed in the first and second active regions 10a, 10b below the sides of the first and second gate electrodes 18A, 18B.

Then, a step similar to that of the first embodiment shown in FIG. 2D is performed. Specifically, first and second sidewalls are formed on the side surfaces of the first and second gate electrodes 18A, 18B with the first and second offset spacers 19a, 19b interposed therebetween. Then, deep n-type and p-type source/drain regions 23a, 23b are formed in the first and second active regions 10a, 10b outside the first and second sidewalls. Then, the n-type and p-type impurities contained in the deep n-type and p-type source/drain regions 23a, 23b are activated by a thermal treatment. Simultaneously, the first adjusting metal (Al) contained in the first adjusting metal film 15Xb is diffused into the second high dielectric constant film 14b. In this step, Al is diffused into the second high dielectric constant film 14b to make the Al concentration gradually decrease from the top to the bottom. Since the second high dielectric constant film 14b has a lower nitrogen concentration than the first high dielectric constant film 14Xa, Al can be diffused into the second high dielectric constant film 14b while reducing the decrease in amount of Al diffused into the second high dielectric constant film 14b. Simultaneously, nitrogen contained in the first adjusting metal film 15Xb is diffused into the second high dielectric constant film 14b. Thus, a high dielectric constant film 14y containing Al and nitrogen (see FIG. 8C described later) is formed between the second underlying film 13b and the second gate electrode 18B.

In this way, the second gate insulating film 14B including the second underlying film 13b, and a second high dielectric constant film 14y containing Al and nitrogen, and having a lower nitrogen concentration than the first high dielectric constant film 14Xa is formed. The Al concentration in the second high dielectric constant film 14y gradually decreases from the top to the bottom. The nitrogen concentration in the second high dielectric constant film 14y gradually decreases from the top to the bottom. The thickness of the second high dielectric constant film 14y is the sum of the thickness of the second high dielectric constant film 14b and the thickness of the first adjusting metal film 15Xb.

Then, steps similar to those of the first embodiment shown in FIGS. 3A-3C are sequentially performed to obtain the structure shown in FIG. 8C.

In this way, the semiconductor device of the present alternative is fabricated. Specifically, a semiconductor device including an n-type MIS transistor nTr having the first gate insulating film 14A including the nitrogen-containing first high dielectric constant film 14Xa, and a p-type MIS transistor pTr having the second gate insulating film 14B including the second high dielectric constant film 14y containing Al and nitrogen, and having a lower nitrogen concentration than the first high dielectric constant film 14Xa is fabricated.

This alternative is different from the first embodiment in the following points.

In the first embodiment, the second high dielectric constant film 14x in the second gate electrode 14B does not contain nitrogen, but contains Al. In this alternative, the second high dielectric constant film 14y in the second gate electrode 14B contains Al and nitrogen.

In this alternative, the first high dielectric constant film 14Xa containing nitrogen, and the second high dielectric constant film 14y containing Al and nitrogen, and having a lower nitrogen concentration than the first high dielectric constant film 14Xa can be fabricated. Thus, the alternative can provide advantages similar to those of the first embodiment.

In the first to third embodiments, Al is described as the first adjusting metal contained in the first adjusting metal film 15. However, the disclosure is not limited to this example.

The polysilicon film used as the silicon film 18 in the first to third embodiments may be replaced with, for example, an amorphous silicon film, a silicon film, etc.

Nickel used as the metal film for silicidation in the first to third embodiments may be replaced with other metals for silicidation, e.g., platinum, cobalt, titanium, tungsten, etc.

In the first to third embodiments, the first and second outer sidewalls are removed. However, the disclosure is not limited to this example, and the first and second outer sidewalls may be left.

In the first to third embodiments, an insulating film which functions as an etch stop film in forming the first and second contact holes 28a, 28b is used as the insulating film 26. However, the disclosure is not limited to this example. For example, a stress-applying insulating film which applies tensile stress in a gate length direction of a channel region of the first active region may be formed as the insulating film formed on the first active region. This can apply the tensile stress in the gate length direction of the channel region of the first active region, thereby improving drive capability of the n-type MIS transistor. In addition, the first outer sidewalls may be removed to bring the stress-applying insulating film into contact with the surfaces of the first inner sidewalls. This can bring the stress-applying insulating film closer to the channel region of the first active region by the thickness of the first outer sidewalls, thereby effectively applying the tensile stress in the gate length direction of the channel region of the first active region. Further, the stress-applying insulating film can be thickened by the thickness of the first outer sidewalls, thereby effectively applying the tensile stress in the gate length direction of the channel region of the first active region.

As described above, the present disclosure can reduce the increase in equivalent oxide thickness of the gate insulating film of the p-type MIS transistor, and can increase the effective work function of the p-type MIS transistor, thereby providing the n-type and p-type MIS transistors with low threshold voltages. Thus, the disclosure is useful for semiconductor devices including the n-type and p-type MIS transistors having the gate insulating film including the high dielectric constant film, and method for fabricating the same.

What is claimed is:

1. A semiconductor device comprising:
a first MIS transistor and a second MIS transistor, wherein
the first MIS transistor includes a first gate insulating film which is formed on a first active region of a semiconductor substrate, and has a first high dielectric constant film, and a first gate electrode formed on the first gate insulating film,
the second MIS transistor includes a second gate insulating film which is formed on a second active region of the semiconductor substrate, and has a second high dielectric constant film, and a second gate electrode formed on the second gate insulating film,
the second high dielectric constant film contains a first adjusting metal,
the first high dielectric constant film contains a second adjusting metal, and the second high dielectric constant film does not contain the second adjusting metal, and
the first high dielectric constant film has a higher concentration of nitrogen than the second high dielectric constant film, and does not contain the first adjusting metal.

2. The semiconductor device of claim 1, wherein the first high dielectric constant film contains nitrogen, and the second high dielectric constant film does not contain nitrogen.

3. The semiconductor device of claim 1, wherein the first adjusting metal is aluminum.

4. The semiconductor device of claim 1, wherein the second adjusting metal is lanthanum.

5. The semiconductor device of claim 1, wherein
the first gate insulating film includes a first underlying film formed on the first active region, and the first high dielectric constant film formed on the first underlying film, and
the second gate insulating film includes a second underlying film formed on the second active region, and the second high dielectric constant film formed on the second underlying film.

6. The semiconductor device of claim 5, wherein the first underlying film and the second underlying film are made of a silicon oxide film.

7. The semiconductor device of claim 1, wherein the first high dielectric constant film and the second high dielectric constant film are made of metal oxide having a dielectric constant of 10 or higher.

8. The semiconductor device of claim 1, wherein
the first gate electrode includes a first metal film formed on the first gate insulating film, and a first silicon film formed on the first metal film, and the second gate electrode includes a second metal film formed on the second gate insulating film, and a second silicon film formed on the second metal film.

9. The semiconductor device of claim 8, wherein the first metal film and the second metal film are made of the same metal material.

10. The semiconductor device of claim 1, further comprising:
   a first sidewall which is formed on a side surface of the first gate electrode, and has an L-shaped cross section;
   a second sidewall which is formed on a side surface of the second gate electrode, and has an L-shaped cross section; and
   an insulating film formed on the first active region and the second active region to cover the first gate electrode, the first sidewall, the second gate electrode, and the second sidewall.

11. The semiconductor device of claim 10, wherein
   the insulating film is a stress-applying insulating film which applies tensile stress in a gate length direction of a channel region of the first active region, and
   the insulating film is in contact with a surface of the first sidewall.

12. The semiconductor device of claim 1, wherein the first MIS transistor is an n-type MIS transistor, and the second MIS transistor is a p-type MIS transistor.

13. The semiconductor device of claim 1, wherein a concentration of the first adjusting metal in the second high dielectric constant film decreases from a top to a bottom of the second high dielectric constant film.

14. The semiconductor device of claim 1, wherein a concentration of nitrogen in the first high dielectric constant film decreases from a top to a bottom of the first high dielectric constant film.

15. The semiconductor device of claim 1, wherein the first high dielectric constant film contains nitrogen, and the first active region contains nitrogen.

16. The semiconductor device of claim 1, wherein a concentration of the second adjusting metal in the first high dielectric constant film decreases from a top to a bottom of the first high dielectric constant film.

* * * * *